United States Patent
Lim et al.

(10) Patent No.: US 9,929,222 B2
(45) Date of Patent: Mar. 27, 2018

(54) SUBSTRATE FOR ORGANIC LIGHT EMITTING DISPLAY DEVICE AND ORGANIC LIGHT EMITTING DISPLAY DEVICE

(71) Applicant: LG Display Co., Ltd., Seoul (KR)

(72) Inventors: YoungNam Lim, Seoul (KR); SeungKyu Choi, Gyeonggi-do (KR); SoonKwang Hong, Daegu (KR); SangHo Lee, Gyeonggi-do (KR); DaeWon Ryu, Gyeonggi-do (KR); Seonghee Noh, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/278,276

(22) Filed: Sep. 28, 2016

(65) Prior Publication Data
US 2017/0092705 A1   Mar. 30, 2017

(30) Foreign Application Priority Data

Sep. 30, 2015 (KR) .......... 10-2015-0137259
Sep. 30, 2015 (KR) .......... 10-2015-0137750
Apr. 30, 2016 (KR) .......... 10-2016-0053635
Sep. 26, 2016 (KR) .......... 10-2016-0123377

(51) Int. Cl.
*H01L 51/00* (2006.01)
*H01L 27/32* (2006.01)
*H01L 51/52* (2006.01)

(52) U.S. Cl.
CPC ........ *H01L 27/3246* (2013.01); *H01L 27/322* (2013.01); *H01L 27/3258* (2013.01); *H01L 27/3262* (2013.01); *H01L 51/5253* (2013.01)

(58) Field of Classification Search
CPC . H01L 51/56; H01L 51/5253; H01L 27/3246; H01L 27/322; H01L 27/3258; H01L 27/3262

See application file for complete search history.

(56) References Cited

U.S. PATENT DOCUMENTS

2007/0159094 A1    7/2007  Oh et al.
2007/0241664 A1*  10/2007  Sakamoto ........... H01L 27/3276
                                                      313/503

(Continued)

FOREIGN PATENT DOCUMENTS

EP        1475849 A2    11/2004
WO    2015/189735 A1    12/2015

OTHER PUBLICATIONS

Extended European Search Report dated Feb. 15, 2017, for corresponding European Patent Application No. 16191000.5.

*Primary Examiner* — Nicholas Tobergte
(74) *Attorney, Agent, or Firm* — Morgan, Lewis & Bockius LLP

(57) ABSTRACT

A substrate for an organic light emitting display device and an organic light emitting display device are provided. The substrate to the organic light emitting display device includes a protective layer having a non-flat shape; a first electrode on the protective layer and having the non-flat shape; and a bank layer on the protective layer and the first electrode. The bank layer having an opening for exposing the first electrode. The protective layer is formed at the opening of the bank layer and a part of an area with the bank layer.

21 Claims, 42 Drawing Sheets

(56) References Cited

U.S. PATENT DOCUMENTS

| | | | |
|---|---|---|---|
| 2008/0024402 A1* | 1/2008 | Nishikawa | H01L 51/5209 345/82 |
| 2009/0001877 A1* | 1/2009 | Park | H01L 51/5246 313/504 |
| 2010/0060148 A1 | 3/2010 | Hwang et al. | |
| 2014/0306241 A1 | 10/2014 | Hirakata et al. | |
| 2014/0346449 A1 | 11/2014 | Choi et al. | |
| 2016/0104413 A1* | 4/2016 | Matsueda | H01L 27/3218 345/694 |

* cited by examiner

SUBSTRATE FOR ORGANIC LIGHT EMITTING DISPLAY DEVICE AND ORGANIC LIGHT EMITTING DISPLAY DEVICE

CROSS-REFERENCE TO RELATED APPLICATIONS

This application claims the priority of Korean Patent Application No. 10-2015-0137259 filed on Sep. 30, 2015, No. 10-2015-0137750 filed on Sep. 30, 2015, No. 10-2016-0053635 filed on Apr. 30, 2016, and No. 10-2016-0123377 filed on Sep. 26, 2016, in the Korean Intellectual Property Office, the disclosure of which is incorporated herein by reference.

BACKGROUND

Field

The present disclosure relates to a substrate for an organic light emitting display device with improved light extraction efficiency and an organic light emitting display device.

Description of the Related Art

In recent years, an organic light emitting display device which has gotten the limelight as a display device has an advantage in that a response time is high, and contrast ratio, emission efficiency, brightness, and a viewing angle are large by using an organic light emitting diode (OLED) having a self-luminance characteristic.

Light emitted from an organic emission layer of the organic light emitting display device passes through various constituent elements of the organic light emitting display device to be discharged to the outside of the organic light emitting display device. However, light which is not discharged to the outside of the organic light emitting display device, but blocked in the organic light emitting display device among the light emitted from the organic emission layer is present and thus, there is a problem in light extraction efficiency of the organic light emitting display device with respect to the front and the side of the organic light emitting display device.

Further, since an optical path length of light emitted from the organic light emitting diode having a flat plane differs with respect to the viewing angle, a color change with respect to the viewing angle occurs and a color shift for red (R), green (G), and blue (B) colors increases, and as a result, chromaticity characteristics become vulnerable on the side.

Accordingly, a scheme that can solve the problem is required.

A substrate for forming an organic emission layer may include a protective layer for flattening a step due to formation of a transistor, an anode electrode formed on the protective layer, and a bank layer formed in an area other than an area for emission. In addition, the organic emission layer is laminated on the flat anode electrode, and as a result, the organic emission layer is also formed in a flat form. Since the flat emission surface significantly depends on an optical path length with respect to a viewing angle, a color change according to a viewing angle of an organic light emitting display device occurs, and as a result, it is characterized that the flat emission surface is vulnerable to a color shift on a side. Further, when an inclination angle is given to an opening of the bank layer in the related art, an amount of some light of a light emitting unit hits and is reflected on an inclination surface of the bank layer, and the amount of a collected light on a front is also small.

In addition, the color shift which occurs on the side of the organic light emitting display device means red, green, and blue color shifts and a white color shift with respect to a viewing angle and since the color shift which occurs on the side increases on the flat emission surface, color shift characteristics are vulnerable on the side. In this case, the color shift may mean a difference in color coordinate with respect to a viewing angle.

SUMMARY

Accordingly, the present invention is directed to a substrate for an organic light emitting display device and an organic light emitting display device that substantially obviate one or more of the problems due to limitations and disadvantages of the related art.

An object of the present disclosure is to provide a substrate for an organic light emitting display device and an organic light emitting display device which can increase light extraction efficiency on the front and the side of the organic light emitting display device, decrease a color shift with respect to a viewing angle, and improve an intensity of lateral brightness of the organic light emitting display device.

Another object of the present disclosure is to provide a substrate for an organic light emitting display device and an organic light emitting display device which can decrease the color shift with respect to a viewing angle in a subpixel area.

Yet another object of the present disclosure is to provide an organic light emitting display device with improved lifespan due to improvement of light extraction efficiency on the front and the side.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a substrate for an organic light emitting display device comprises a protective layer, a first electrode, and a bank layer. The protective layer has a non-flat shape. The first electrode having the same non-flat shape is positioned on the protective layer. The bank layer is positioned on the protective layer and the first electrode and includes an opening for exposing the first electrode. The protective layer is formed in the opening of the bank layer and below a some part of the bank layer.

In another aspect, an organic light emitting display device comprises a bank layer, a protective layer and an organic light emission layer. The protective layer has a viewing angle enhancement structure. The organic light emitting display device includes a plurality of pixels and subpixels constituting the pixels. The bank layer exposes an emission area of the subpixel and includes an inclined opening. The organic emission layer is disposed on the protective layer including the viewing angle enhancement structure and along a form of the structure.

According to the present disclosure, a substrate for an organic light emitting display device including a protective layer having a non-flat shape is provided. Accordingly, it is possible to improve light extraction efficiency and decrease a color shift with respect to a viewing angle.

Further, according to the present disclosure, the substrate for the organic light emitting display device including the protective layer having the non-flat shape is provided. Accordingly, since it is possible to substantially equally maintain an optical path with respect to a viewing angle, it is possible to decrease the color shift with respect to a viewing angle and improve an intensity of lateral brightness of the organic light emitting display device.

In addition, according to the present disclosure, the substrate for the organic light emitting display device including a bank layer having an inclined opening formed at a predetermined angle or higher, or an opening having a curved shape is provided to improve the light extraction efficiency on the front.

According to the present disclosure, a substrate for the organic light emitting display device having a non-flat shape of a protective layer, which is formed in an opening of a bank layer and an area of the bank layer is provided to suppress occurrence of a deviation of the non-flat shape disposed in an emission area and decrease the color shift with respect to a viewing angle.

According to the present disclosure, a substrate for the organic light emitting display device having vertical lengths or horizontal lengths of a plurality of emission areas which are different from each other is provided to improve a lifespan of an organic light emitting diode.

According to the present disclosure, the organic light emitting display device including the protective layer having a viewing angle enhancement structure is provided to improve the light extraction efficiency and decrease the color shift with respect to a viewing angle.

According to the present disclosure, the organic light emitting display device having the bank layer including the inclined opening for exposing the emission area of a subpixel or the opening having the curved shape is provided to improve light efficiency on a front of the organic light emitting display device.

According to the present disclosure, in a pixel including a plurality of subpixels, an organic light emitting display device formed so as not to include the viewing angle enhancement structure on the protective layer disposed in at least one subpixel among the plurality of subpixels is provided to improve light efficiency on the front of the organic light emitting display device.

According to the present disclosure, in a pixel including a plurality of subpixels, an organic light emitting display device in which the protective layer of one subpixel among two or more subpixels includes a concave portion and the protective layer of the other one subpixel includes a convex portion is provided to decrease the color shift with respect to a viewing angle.

According to the present disclosure, at least two or more openings of the bank layer in one subpixel are formed, and as a result, light emitted through the concave portion is reflected on a partition wall to improve the light efficiency on the front of the organic light emitting display device.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Figure 1:
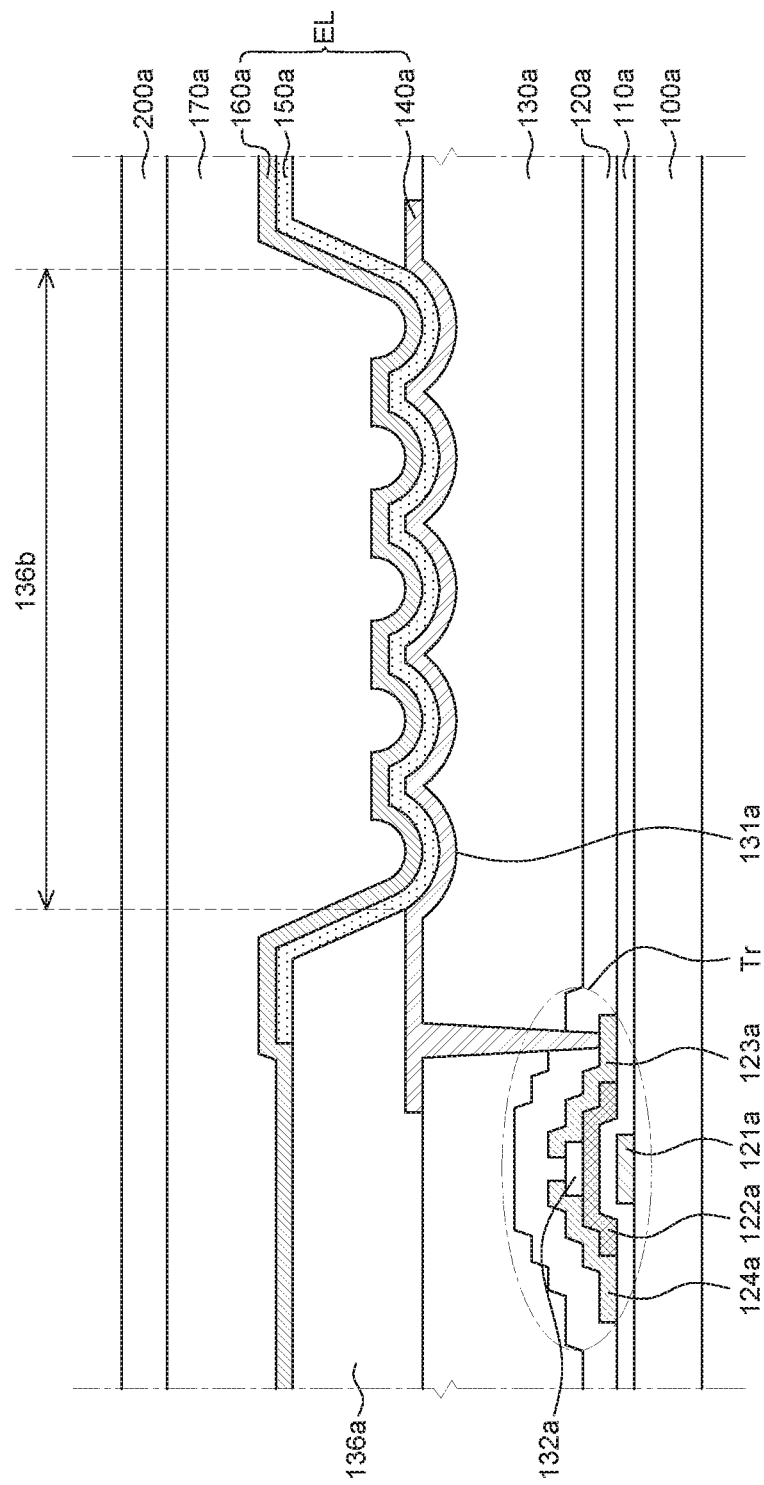
FIG. 1 is a cross-sectional view of an organic light emitting display device to which exemplary embodiments of the present disclosure are applied.

Hereinafter, exemplary embodiments of the present disclosure will be described with reference to the accompanying drawings. The following introduced exemplary embodiments are provided as examples so that the present disclosure will fully convey the spirit of the present disclosure to those skilled in the art. As those skilled in the art would realize, the described embodiments may be modified in various different ways, all without departing from the spirit or scope of the present disclosure. In addition, in the drawings, the size and the thickness of an apparatus may be exaggerated and expressed for easy description. Like reference numerals designate like elements throughout the specification.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the present specification. Further, in the following description, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or higher parts may be positioned between the two parts unless the terms are used with the term "immediately" or "directly" is not used.

When the position relation between two parts is described using the terms such as "on", "above", "below", and "next", one or higher parts may be positioned between the two parts unless the terms are used with the term "immediately" or "directly" is not used.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

The features of various embodiments of the present disclosure can be partially or entirely bonded to or combined with each other and can be interlocked and operated in technically various ways as can be fully understood by a person having ordinary skill in the art, and the embodiments can be carried out independently of or in association with each other.

FIG. 1 is a cross-sectional view of an organic light emitting display device to which exemplary embodiments of the present disclosure are applied. Referring to FIG. 1, the organic light emitting display device to which exemplary embodiments of the present disclosure are applied includes a thin film transistor Tr and an organic light emitting element EL electrically connected with the thin film transistor Tr.

The thin film transistor Tr includes a gate electrode 121a, an active layer 122a, a source electrode 124a, and a drain electrode 123a. And, the organic light emitting element EL includes a first electrode 140a, an organic emission layer 150a, and a second electrode 160a.

Particularly, the gate electrode 121a of the thin film transistor Tr and a first insulating layer 110a are disposed on a first substrate 100a. The active layer 122a overlapping with the gate electrode 121a is disposed on the first insulating layer 110a, and an etch stop layer 132a for protecting a channel region of the active layer 122a is disposed on the active layer 122a. The etch stop layer may also be omitted.

And, the source electrode 124a and the drain electrode 123a which contact the active layer 122a are disposed on the active layer 122a, and a second insulating layer 120a is disposed on the source electrode 124a and the drain electrode 123a. The drain electrode 123a is illustrated to be connected with the first electrode 140a through a contact hole of the second insulating layer 120a, but the organic light emitting display device to which the exemplary embodiments of the present disclosure may be applied is not limited to FIG. 1. The source electrode 124a and the first electrode 140a may be connected to each other, and a buffer layer disposed between the first substrate 100a and the active layer 122a may be further included. Further, a kind of thin film transistor Tr which may be applied to the organic light emitting display device may apply a coplanar structure and the like in addition to the staggered structure of FIG. 1.

Further, a protective layer 130a is disposed on the second insulating layer 120a. Meanwhile, a light guide mode constituted by a surface plasmon component generated on a boundary between a metal and an organic layer and an organic layer inserted into both reflective layers occupies approximately 60% to 70% of emitted light. Accordingly, a phenomenon in which 60% to 70% of the light is not emitted but blocked in the organic emission layer 150a is generated, and it is required to extract the light generated from the organic emission layer 150a to the outside of the display device.

To solve the problem, the protective layer 130a of the organic light emitting display device according to the exemplary embodiments of the present disclosure may have a non-flat shape implemented to decrease a color shift with respect to a viewing angle. That is, the protective layer 130a may include a viewing angle enhancement structure and for example, may be implemented by forming a plurality of concave portions 131a disposed at regular intervals. The plurality of concave portions 131a may have a hemispherical shape, a semi-ellipsoidal shape, or a semi-polygonal shape, but is not limited thereto and may be a shape for forming a non-flat upper surface.

The plurality of concave portions 131a may be disposed at a position corresponding to an emission area of each subpixel. Herein, the emission area means an area in which the organic emission layer 150a emits light by the first electrode 140a and the second electrode 160a. Further, the emission area may mean an area where the first electrode 140a is exposed by an opening 136b of a bank layer 136a disposed on the first electrode 140a. The emission area may include an area where the organic emission layer 150a is formed on the bank layer 136a in the first electrode 140a to emit the light.

The plurality of concave portions 131a is disposed at the position corresponding to the emission area of each subpixel to increase an effect of extracting the light emitted from the organic light emitting element EL to the outside of the display device. That is, the protective layer 130a having the non-flat shape is included to improve light extraction efficiency and decrease a color shift with respect to a viewing angle. Further, since an optical path length with respect to a viewing angle may be substantially equally maintained, it is possible to decrease the color shift with respect to a viewing angle and improve the intensity of lateral brightness.

On the protective layer 130a, the first electrode 140a of the organic light emitting element EL which is connected with the drain electrode 123a of the thin film transistor Tr is disposed. Further, in order to improve the light extraction ability of the organic emission layer 150a, a reflective layer may be further disposed below the first electrode 140a.

And, the bank layer 136a is disposed on the protective layer 130a to expose a part of the upper surface of the first electrode 140a, and on the upper surface of the first electrode 140a exposed by the bank layer 136a and the bank layer 136a, the organic emission layer 150a may be disposed.

That is, the bank layer 136a is disposed on the protective layer 130a and the first electrode 140a and includes the opening 136b exposing the first electrode 140a. The bank layer 136a serves to divide adjacent pixel (alternatively, subpixel) areas and may be disposed between the adjacent pixel (alternatively, subpixel) areas. The concave portion 131a of the protective layer 130a may be disposed to overlap with the opening 136b of the bank layer 136a. As described above, since the concave portion 131a of the protective layer 130a is disposed to overlap with a color filter layer, in the case of a top-emission type organic light emitting display device, the concave portion 131a of the protective layer 130a may overlap with the opening 136b of the bank layer 136a and the color filter layer. In the case of a bottom emission type organic light emitting display device, the concave portion 131a of the protective layer 130a overlaps with the opening 136b of the bank layer 136a and may overlap with the color filter layer disposed on the second insulating layer 120a.

Herein, the organic emission layer 150a may be disposed only on the upper surface of the first electrode 140a exposed by the bank layer 136a or disposed on the first electrode 140a and up to a part of a top surface of the bank layer 136a. In addition, the second electrode 160a of the organic light emitting element EL is disposed to overlap with the organic emission layer 150a and the bank layer 136a.

Further, an encapsulation layer 170a for protecting the organic light emitting element EL from moisture and oxygen is disposed on the second electrode 160a. In FIG. 1, the encapsulation layer 170a is illustrated as a configuration of a single layer, but the exemplary embodiments of the present disclosure are not limited thereto and the encapsulation layer 170a may also be formed of a multilayer. A second substrate 200a may be disposed on the encapsulation layer 170a.

Further, a polarizing plate may be disposed on the bottom surface of the first substrate 100a. The polarizing plate may be a polarizing plate having a polarization axis in a predetermined direction and is configured to transmit only light having an axis in the same direction as the polarization axis in the light incident from the bottom of the first substrate 100a. In addition, the polarizing plate has a feature having the polarizing axis in the predetermined direction, but the exemplary embodiments of the present disclosure are not limited thereto, and the polarizing plate may include a configuration which further includes a phase retardation film. In addition, the polarizing plate may be configured by a single layer or a plurality of layers.

Further, FIG. 1 illustrates a top-emission type organic light emitting display device, but the exemplary embodiments of the present disclosure may be applied to a bottom-emission or dual-emission type organic light emitting display device.

Meanwhile, when the exemplary embodiment of the present disclosure may be applied to the bottom-emission type organic light emitting display device, a color filter layer may be disposed on the second insulating layer 120a. In this case, the color filter layer may be disposed in each of a plurality of subpixels or only in some of the plurality of subpixels.

Meanwhile, the color filter layer may be disposed at a position corresponding to the emission area of each subpixel. Herein, the emission area means an area where the organic emission layer 150a emits the light by the first electrode 140a and the second electrode 160a, and the forming of the color filter layer at the position corresponding to the emission area means that the color filter layer is disposed to suppress the light emitted in adjacent emission areas from being mixed with each other.

In the organic light emitting display device described above, in order to decrease a color shift with respect to a viewing angle, the protective layer 130a with the concave portions 131a disposed at regular intervals may be constituted.

In this case, in the light incident to an interface between the concave portion 131a and the first electrode 140a of the organic light emitting element, the light incident at an incident angle of a total reflection critical angle or less is reflected on the reflective layer to be extracted to the outside of the second substrate 200a as it is. In addition, the light incident at an incident angle of the total reflection critical angle or higher is not blocked in the organic light emitting element EL, but runs against the concave portion 131a and thus the optical path length is changed. Finally, a traveling angle of the light is smaller than the total reflection critical angle and thus the light is extracted to the outside of the second substrate 200a. That is, when the protective layer 130a is flat, the light that is incident at the incident angle of the total reflection critical angle or higher so as not to be extracted to the outside may be extracted to the outside by the concave portion 131a in the protective layer 130a, thereby improving light extraction efficiency of the organic light emitting display device. Further, the reflective layer is formed below the first electrode 140a to more improve the light extraction efficiency of the organic light emitting display device.

In addition, a pixel P includes one or more subpixels SP. The subpixel means a unit in which a specific one kind of color filter layer is formed, or the color filter layer is not formed and the organic light emitting element may emit light having a particular color. The color defined in the subpixel may include red R, green G, and blue B, and selectively white W, but the present disclosures are not limited thereto.

However, for convenience of description, exemplary embodiments to be described below will be described as a configuration in which one pixel includes three subpixels. However, the present disclosure is not limited thereto and one pixel may also include four subpixels including the white.

Further, an electrode which is connected to the thin film transistor controlling light emission in each subpixel area of a display panel is called the first electrode and an electrode disposed on the front of the organic light emitting display device or to include two or more pixel areas is called the second electrode. When the first electrode is an anode electrode, the second electrode is a cathode electrode, and a reverse case is possible. Hereinafter, the anode electrode as an example of the first electrode and the cathode electrode as an example of the second electrode will be mainly described, but the present disclosure is not limited thereto.

Further, in the aforementioned subpixel area, a color filter layer having a single color is disposed or not. Further, a light-scattering layer may be disposed in each subpixel area in order to enhance light extraction efficiency of the organic emission layer. The light-scattering layer may be called a viewing angle enhancement structure, or a protective layer having a non-flat shape and referred to as a micro lens array, a nano pattern, a diffuse pattern, and a silica bead.

Hereinafter, as examples of the light-scattering layer, a protective layer having a concave portion or a convex portion or a plurality thereof, which is a kind of micro lens array will be mainly described, but the exemplary embodiments according to the present disclosure are not limited thereto, and various structures for scattering the light may be combined.

Exemplary embodiments of an organic light emitting display device which may be applied to the aforementioned organic light emitting display device will be described below.

Figure 2:
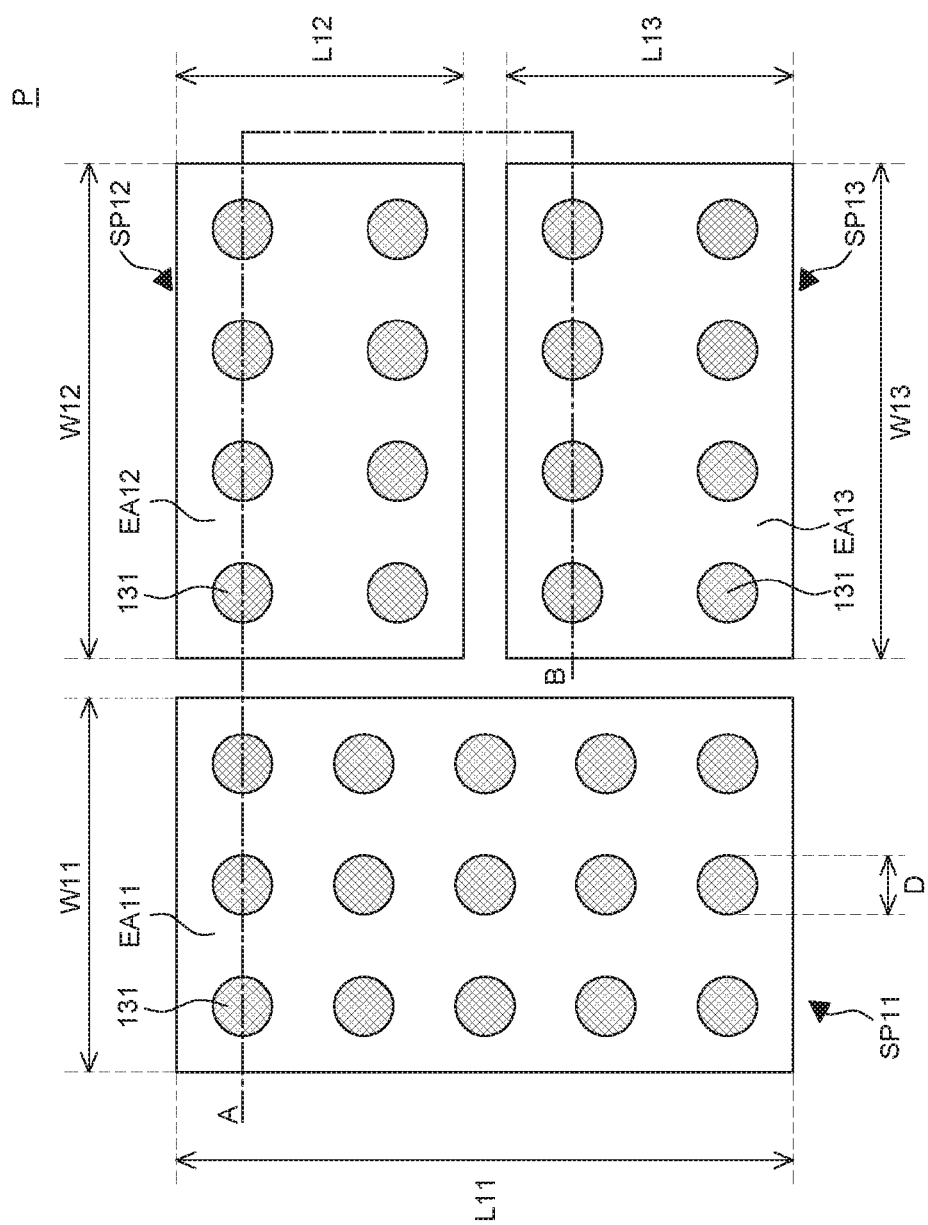
FIG. 2 is a plane view illustrating an emission area of an organic light emitting display device according to a first exemplary embodiment of the present disclosure.

FIG. 2 is a plane view illustrating an emission area of an organic light emitting display device according to a first exemplary embodiment of the present disclosure.

Referring to FIG. 2, the organic light emitting display device according to a first exemplary embodiment of the present disclosure includes a first subpixel SP11, a second subpixel SP12, and a third subpixel SP13.

In this case, the second subpixel SP12 and the third subpixel SP13 may be disposed in parallel in a horizontal direction from the first subpixel SP11. And, the second subpixel SP12 and the third subpixel SP13 may be disposed in parallel in a vertical direction.

The first subpixel SP11, the second subpixel SP12, and the third subpixel SP13 may include emission areas emitting different colors, respectively. For example, a first emission area EA11 of the first subpixel SP11 may emit light of blue B, a second emission area EA12 of the second subpixel SP12 may emit light of green G, and a third emission area EA13 of the third subpixel SP13 may emit light of red R.

And, spectrums (spectrums corresponding to red, green, and blue) of the light emitted from the emission areas are just exemplified, and the spectrums of the light generated from the emission areas EA11, EA12, and EA13 of the first to third subpixels SP11, SP12, and SP13 may be various.

And, a vertical length L11 of the first emission area EA11 may be larger than a vertical length L12 of the second emission area EA12 and a vertical length L13 of the third emission area EA13. Further, the vertical length L13 of the third emission area EA13 may be equal to or larger than the vertical length L12 of the second emission area EA12.

Further, a horizontal length W11 of the first emission area EA11 may be smaller than a horizontal length W12 of the second emission area EA12 and a horizontal length W13 of the third emission area EA13. And, the horizontal length W12 of the second emission area EA12 may be equal to or larger than the horizontal length W13 of the third emission area EA13.

As such, an area of the emission area of each subpixel may be adjusted by adjusting the horizontal and vertical lengths for the emission area of each subpixel. For example, as illustrated in FIG. 2, the area of the first emission area EA11 of the first subpixel SP11 may be larger than the area of the second emission area EA12 of the second subpixel SP12 and the third emission area EA13 of the third subpixel SP13.

Further, the areas of the second emission area EA12 and the third emission area EA13 may be equal to each other. However, when the vertical length L13 or the horizontal length W13 of the third emission area EA13 is larger than either the vertical length L12 or the horizontal length W12 of the second emission area EA12, the area of the third emission area EA13 may be larger than the area of the second emission area EA12.

As a result, when the efficiency of the organic light emitting element disposed in each subpixel is low or the lifespan is short, the efficiency or the lifespan of the organic light emitting element may be compensated by adjusting the area of the emission area. That is, as described above, the sizes of the emission areas are decreased in order of the first subpixel SP11, the third subpixel SP13, and the second subpixel SP12. In this case, according to the efficiency of the organic light emitting element, the first subpixel SP11, the third subpixel SP13, and the second subpixel SP12 may be disposed to emit light of blue, green, and red, respectively, but the present disclosures are not limited thereto.

Accordingly, the vertical lengths or the horizontal lengths of the plurality of emission areas are differently formed, thereby improving the lifespan of the organic light emitting element.

And, the first emission area EA11, the second emission area EA12, and the third emission area EA13 may include a plurality of concave portions 131. The concave portions 131 may be spaced apart from other concave portions 131 at regular intervals. Further, the plurality of concave portions 131 may have a circular shape on a plane, but the exemplary embodiment of the present disclosures are not limited thereto and may have an oval shape or a polygonal shape such as a hexagonal shape.

Diameters D of the plurality of concave portions 131 disposed in the first emission area EA11, the second emission area EA12, and the third emission area EA13 may be substantially the same as each other. As a result, the light emitted from each of the emission areas EA11, EA12, and EA13 may be extracted to the outside of the organic light emitting display device with substantially the same efficiency. And, the diameters D of the plurality of concave portions 131 disposed in each of the first subpixel SP11, the second subpixel SP12, and the third subpixel SP13 of the organic light emitting display device according to the present disclosure are not limited thereto, and may be different from each other.

Such a structure will be described below in detail with reference to FIG. 3.

Figure 3:
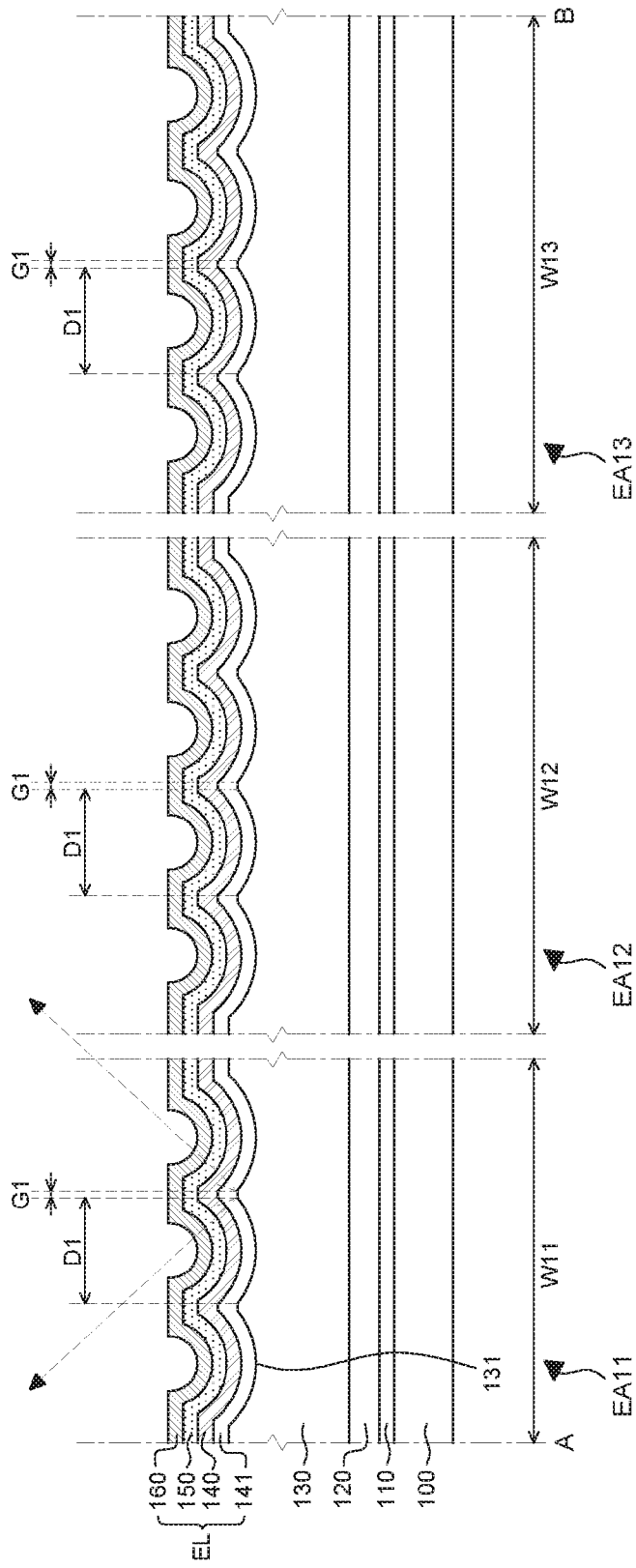
FIG. 3 is a cross-sectional view of the organic light emitting display device taken along line A-B according to the first exemplary embodiment of the present disclosure.

FIG. 3 is a cross-sectional view of the organic light emitting display device taken along line A-B according to the first exemplary embodiment of the present disclosure.

Referring to FIG. 3, in the emission area of the organic light emitting display device of the first exemplary embodiment of the present disclosure, the plurality of insulating layers 110 and 120 and the protective layer 130 with the plurality of concave portions 131 are disposed on the substrate 100, and the organic light emitting element EL is disposed on the protective layer 130. Such a configuration may be applied to all of the first emission area EA11, the second emission area EA12, and the third emission area EA13.

On the protective layer 130 with the plurality of concave portions 131, the reflective layer 141 may be disposed, and on the reflective layer 141, the first electrode 140, the organic emission layer 150, and the second electrode 160 of the organic light emitting element EL may be sequentially disposed. In this case, shapes of the reflective layer 141, the first electrode 140, the organic emission layer 150, and the second electrode 160 may correspond to the shape of the concave portions 131 formed on the protective layer 130.

The organic emission layer 150 may have a small thickness in the area corresponding to an inclined surface of the concave portions 131. Particularly, the organic emission layer 150 is formed by a deposition method having straightness, and thus the thickness of the organic emission layer 150 in a vertical direction to the inclined surface of the concave portions 131 may be smaller than that of the organic emission layer 150 formed in the remaining region except for the inclined surface of the concave portions 131. The thickness of the organic emission layer 150 on the inclined surface of the concave portions 131 is small, and thus the current density on the inclined surface of the concave portions 131 is higher than other regions, thereby improving the light emission efficiency of the organic light emitting element EL. Accordingly, the organic light emitting element EL mainly emits the light in the region corresponding to the inclined surface of the concave portions 131.

Further, in the region corresponding to the inclined surface of the concave portions 131, an incident angle of the light incident to the inclined surface of the concave portions 131 is mainly gathered into a total reflection critical angle to enable multiple reflections and improve light extraction efficiency.

In detail, some of the light emitted from the organic emission layer 150 of the organic light emitting element EL is emitted in the second electrode 160 direction of the organic light emitting element EL to be emitted to the outside of the organic light emitting display device. Some of the remaining light is emitted in the first electrode 140 direction of the organic light emitting element EL.

Herein, a refractive index of the organic emission layer 150 may be substantially the same as that of the first electrode 140. Accordingly, the light emitted from the organic emission layer 150 passes through the first electrode 140 without changing the optical path on an interface between the organic emission layer 150 and the first electrode 140.

In the light passing through the first electrode 140, the light that reaches the reflective layer 141 at an incident angle smaller than the total reflection critical angle meets the reflective layer 141 and the optical path is converted to the second electrode 160 direction, and thus the light is emitted to the outside of the organic light emitting display device.

And, the light that reaches the reflective layer 141 at an incident angle larger than the total reflection critical angle is totally reflected at the interface between the first electrode 140 and the reflective layer 141. The totally reflected light hits the reflective layer 141 having the same form as the concave portions 131 formed on the protective layer 130 at least two times and may be finally changed to the light directed at an incident angle smaller than the total reflection critical angle.

Accordingly, due to the concave portions 131 formed in the first emission area EA11, the second emission area EA12, and the third emission area EA13, the light directed at the incident angle larger than the total reflection critical angle is not blocked in the organic light emitting element EL, but extracted to the outside of the organic light emitting display device, thereby improving the light efficiency.

Particularly, on a flat emission surface, there is a problem in that an optical path length largely varies with respect to a viewing angle and thus a color shift with respect to the viewing angle is generated. However, in the organic light emitting display device according to the first exemplary embodiment of the present disclosure, each of the emission areas EA11, EA12, and EA13 has the plurality of concave portions 131, thereby improving the color shift with respect to a viewing angle in the side of the organic light emitting display device. And, the optical path lengths with respect to a viewing angle may be substantially equally maintained, thereby improving the color shift with respect to a viewing angle and improve the intensity of lateral brightness of the organic light emitting display device.

In other words, in the light passing through the first electrode 140, most of the light that reaches the reflective layer 141 at the incident angle smaller than the total reflection critical angle may be emitted in a front direction. And, in the light passing through the first electrode 140, most of the light that reaches the reflective layer 141 at the incident angle larger than the total reflection critical angle may be emitted in a side direction.

That is, due to the viewing angle enhancement structure configured by the plurality of concave portions 131, the light is also spread in the side direction in each of the emission areas EA11, EA12, and EA13, thereby improving light extraction efficiency of the side.

And, a gap G1 between the concave portions 131 formed on the protective layer 130 and other adjacent concave portions 131 may be the same as each other with a predetermined length. However, the gap G1 between the concave portions 131 and other adjacent concave portions 131 is not limited to the first exemplary embodiment of the present disclosure and may be formed as illustrated in FIG. 4.

Figure 4:
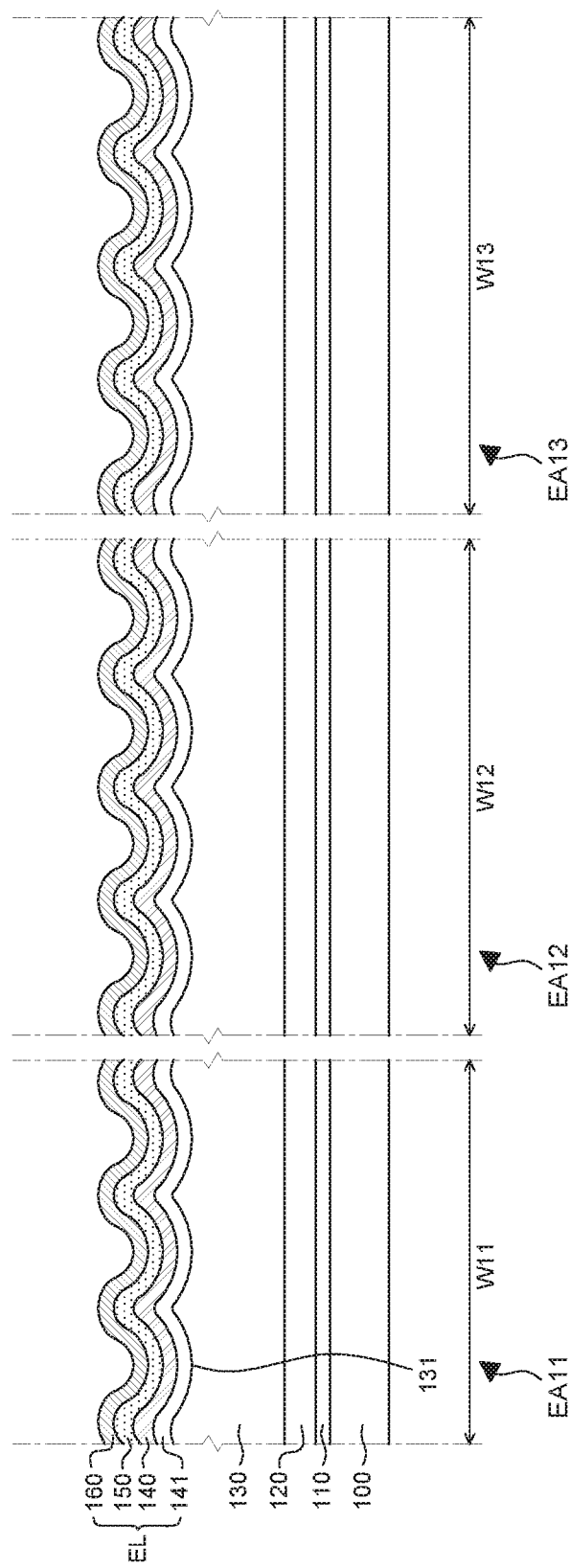
FIG. 4 is a view illustrating another form of a cross-sectional view of the organic light emitting display device taken along line A-B according to the first exemplary embodiment of the present disclosure.

FIG. 4 is a diagram illustrating another form for the gap G1 between the concave portions of the present disclosure and other adjacent concave portions.

Referring to FIG. 4, the plurality of concave portions 131 formed on the protective layer 130 are not spaced apart from each other, but disposed to be connected to each other.

That is, the gap between the concave portion 131 and another adjacent concave portion 131 may be 0 (zero), and according to the shape of the plurality of concave portions 131 formed on the protective layer 130, the reflective layer 141 and the organic light emitting element EL may be formed.

Figure 5:
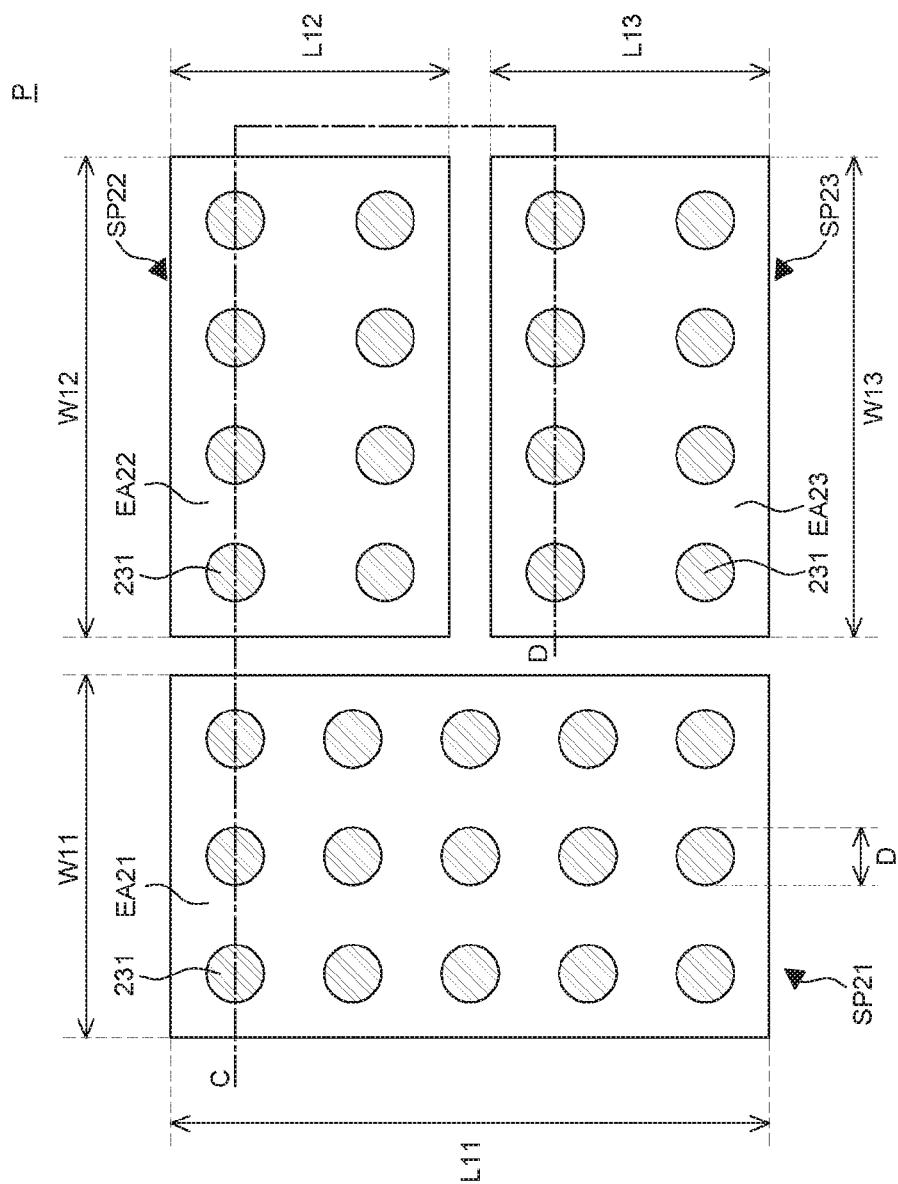
FIG. 5 is a plane view illustrating an emission area of an organic light emitting display device according to a second exemplary embodiment of the present disclosure.
Figure 6:
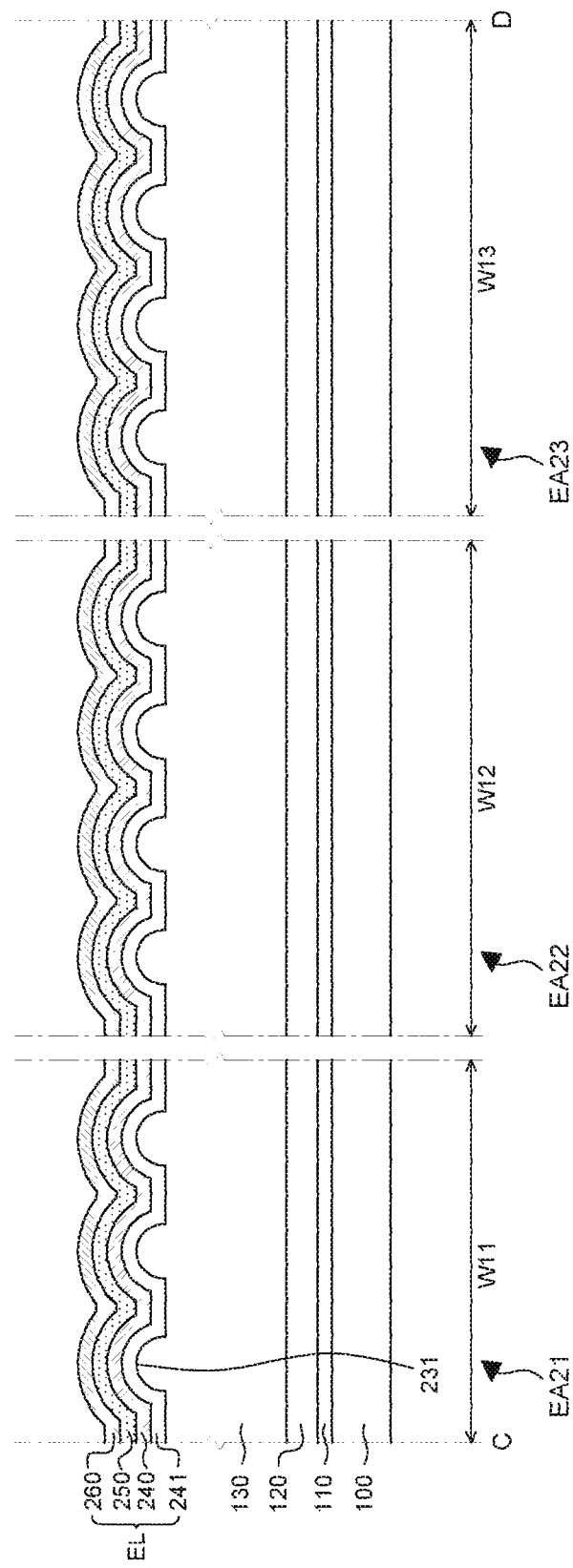
FIG. 6 is a cross-sectional view of the organic light emitting display device taken along line C-D according to the second exemplary embodiment of the present disclosure.

And, the shape of the concave portion 131 illustrated in FIG. 2 is not limited to the aforementioned exemplary embodiment and may be formed as illustrated in FIGS. 5 and 6.

FIG. 5 is a plane view illustrating an emission area of an organic light emitting display device according to a second exemplary embodiment of the present disclosure and FIG. 6 is a cross-sectional view of the organic light emitting display device taken along line C-D according to the second exemplary embodiment of the present disclosure. The organic light emitting display device according to the second exemplary embodiment of the present disclosure may include the same components as the exemplary embodiment described above. The description duplicated with the exemplary embodiment described above may be omitted or may be brief below. Further, like components have like reference numerals.

In FIG. 5, there is a difference in that the plurality of concave portions in the plan view of FIG. 2 is formed of a plurality of convex portions 231. That is, in each of a first emission area EA21, a second emission area EA22, and a third emission area EA23 of the organic light emitting display device according to the second exemplary embodiment, a plurality of convex portions 231 may be adjacent to each other at regular intervals.

Referring to FIG. 6, the exemplary embodiment having the plurality of convex portions 231 will be described below in detail. In FIG. 6, the plurality of convex portions 231 formed on the protective layer 130 are disposed at regular intervals.

As a result, a reflective layer 241 disposed on the protective layer 130, and a first electrode 240, an organic emission layer 250, and a second electrode 260 of the organic light emitting element EL may also be formed to have a plurality of convex portions according to the shape of the protective layer 130. As such, the organic light emitting display device includes the protective layer 130 having the plurality of convex portions 231 and the organic light emitting element EL in the first emission area EA21, the second emission area EA22, and the third emission area EA23, thereby minimizing a color shift with respect to a viewing angle.

Figure 7:
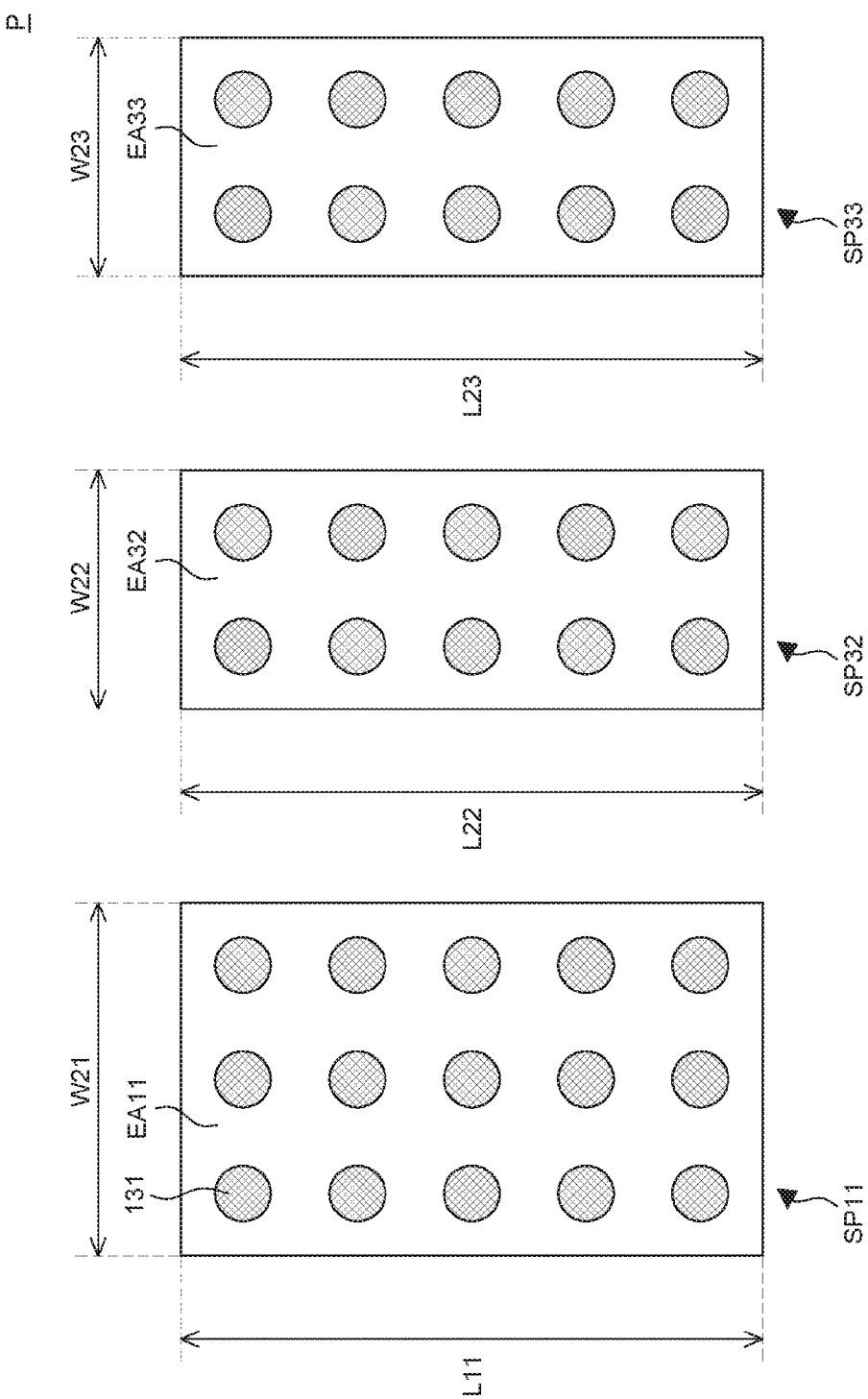
FIG. 7 is a plan view illustrating an emission area of an organic light emitting display device according to a third exemplary embodiment of the present disclosure.

Further, the shape of the convex portion is not limited to the aforementioned exemplary embodiment and may be formed as illustrated in FIG. 7.

FIG. 7 is a plan view illustrating an emission area of an organic light emitting display device according to a third exemplary embodiment of the present disclosure. The organic light emitting display device according to the third exemplary embodiment of the present disclosure may include the same constitute elements as the aforementioned exemplary embodiments. The description duplicated with the aforementioned exemplary embodiments may be omitted or may be brief below. Further, like components have like reference numerals.

Referring to FIG. 7, the organic light emitting display device according to the third exemplary embodiment of the present disclosure includes a first subpixel SP11, a second subpixel SP32, and a third subpixel SP33. The first subpixel SP11 includes a first emission area EA11, the second subpixel SP32 includes a second emission area EA32, and the third subpixel SP33 includes a third emission area EA33.

And, a vertical length L11 of the first emission area EA11 may be equal to a vertical length L22 of the second emission area EA32 and a vertical length L23 of the third emission area EA33. Further, a horizontal length W21 of the first emission area EA11 is larger than a horizontal length W23 of the third emission area EA33 and a horizontal length W23 of the third emission area EA33 may be larger than a horizontal length W22 of the second emission area EA32.

Accordingly, the emission area of the first emission area EA11 may be larger than that of the third emission area EA33 and the emission area of the third emission area EA33 may be larger than that of the second emission area EA32. As a result, considering the efficiency and the lifespan of the organic light emitting diodes emitting light of different colors, the organic light emitting diodes may be disposed in the first emission area EA11, the second emission area EA32, and the third emission area EA33. That is, as described above, the sizes of the emission areas may be decreased in order of the first emission area EA11, the third emission area EA33, and the second emission area EA32. In this case, according to the efficiency or the lifespan of the organic light emitting diode, the first emission area EA11, the third emission area EA33, and the second emission area EA32 may be disposed to emit light of blue, green, and red, respectively, but the present disclosure is not limited thereto.

Accordingly, the horizontal lengths of the plurality of emission areas are differently formed, thereby improving the efficiency or the lifespan of the organic light emitting diode.

Next, an organic light emitting display device according to a fourth exemplary embodiment of the present disclosure will be described below.

Figure 8:
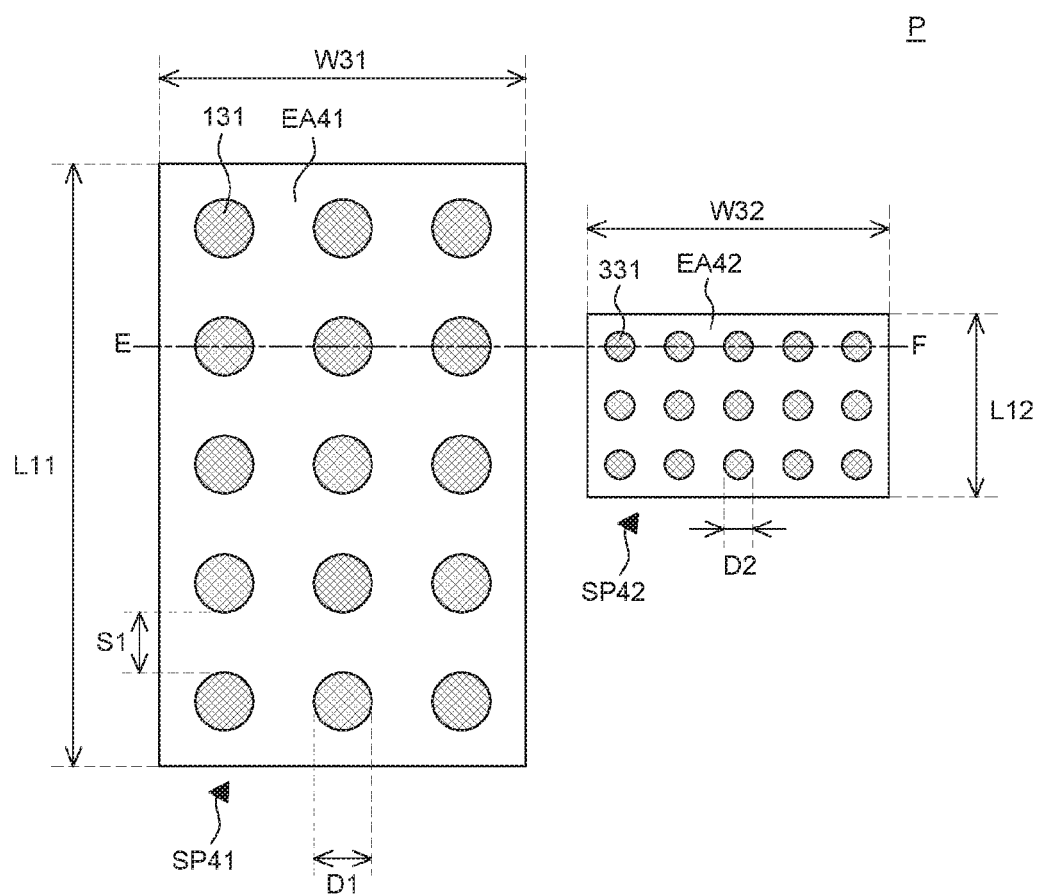
FIG. 8 is a plan view illustrating an emission area of an organic light emitting display device according to a fourth exemplary embodiment of the present disclosure.

FIG. 8 is a plan view illustrating a part of an emission area of an organic light emitting display device according to a fourth exemplary embodiment of the present disclosure. The organic light emitting display device according to the fourth exemplary embodiment of the present disclosure may include the same components as the exemplary embodiments described above. The description duplicated with the aforementioned exemplary embodiments may be omitted or may be brief below. Further, like components have like reference numerals.

Referring to FIG. 8, the organic light emitting display device according to the fourth exemplary embodiment of the present disclosure includes a plurality of subpixels SP41 and SP42, and each subpixel includes an emission area. In FIG. 8, only two subpixels that may be applied to the organic light emitting display device are illustrated, but the two subpixels illustrated in FIG. 8 may be applied to all organic light emitting display devices having a pixel constituted by two or more subpixels.

Accordingly, the organic light emitting display device according to the fourth exemplary embodiment of the present disclosure includes a first subpixel SP41 and a second subpixel SP42, and the first subpixel SP41 includes a first emission area EA 41 and the second subpixel SP42 includes a second emission area EA 42. In this case, the first emission area EA 41 and the second emission area EA 42 may emit light of different colors.

The first emission area EA 41 includes a plurality of first concave portions 131. In this case, on a plane, the plurality of first concave portions 131 may be disposed in series at regular intervals in a vertical direction and a horizontal direction. In this case, a distance between the adjacent concave portions 131 corresponds to S1 in the drawing.

Further, the second emission area EA 42 includes a plurality of second concave portions 331 and the plurality of second concave portions 331 may also be disposed in a line at regular intervals in a vertical direction and a horizontal direction.

The plurality of first concave portions 131 and the plurality of second concave portions 331 are disposed at regular intervals in a vertical direction and a horizontal direction, thereby decreasing the color shift with respect to a viewing angle on the side of the organic light emitting display device by the plurality of first concave portions 131 and the plurality of second concave portions 331.

Figure 9:
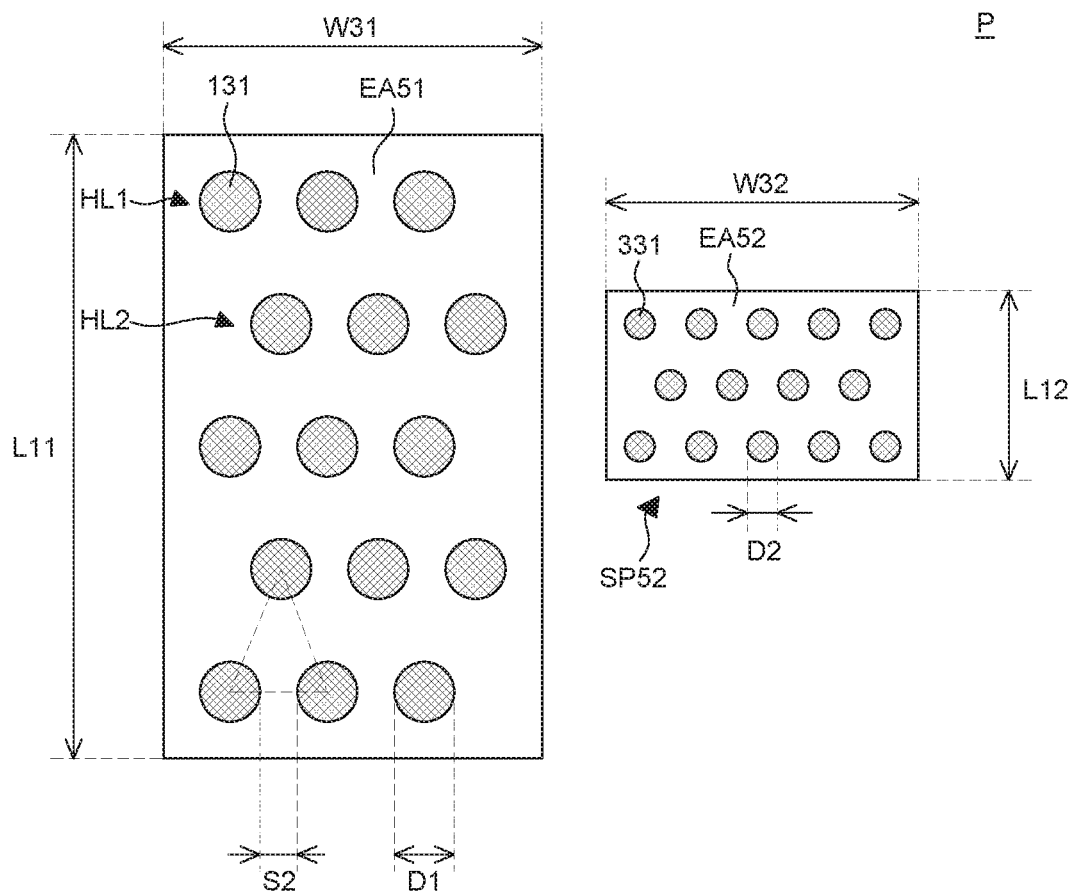
FIG. 9 is a plan view illustrating an arrangement structure of a plurality of concave portions in the emission area of the organic light emitting display device according to the present disclosure.

And, the arrangement of the first concave portions 131 and the second concave portions 331 of the organic light emitting display device according to the fourth exemplary embodiment is not limited thereto, and the first concave portions 131 and the second concave portions 331 may be disposed as illustrated in FIG. 9.

FIG. 9 is a plan view illustrating an arrangement structure of a plurality of concave portions in the emission area of the organic light emitting display device.

Referring to FIG. 9, on a plane, a plurality of concave portions 131 disposed in a first emission area EA51 and a plurality of concave portions 331 disposed in a second emission area EA52 may be disposed in zigzag. In the case, the first emission area EA51 and the second emission area EA52 may be substantially the same as the first emission area EA41 and the second emission area EA42 of FIG. 8, respectively.

For example, in the first emission area EA51, a plurality of concave portions 131 disposed in parallel in a first horizontal direction HL1 may be disposed in zigzag with a plurality of concave portions 131 disposed in parallel in a second horizontal direction HL2. Alternatively, internal angles of a triangle occurring when centers of three adjacent concave portions 131 are connected to each other may be disposed to be acute angles. In this case, the adjacent concave portions 131 may be disposed at regular intervals and correspond to S2 in the drawing.

Accordingly, in comparison with FIG. 8, the distance S2 between the adjacent concave portions 131 of FIG. 9 may be smaller than the distance S1 between the adjacent concave portions 131 of FIG. 8.

As such, the plurality of concave portions 131 is disposed in the zigzag shape or so that the internal angles of the triangle occurring when the centers of three adjacent concave portions 131 are connected to each other are the acute angles. As a result, the concave portion 131 in the second horizontal direction HL2 may be disposed between the concave portions 131 in the first horizontal direction HL1 and thus the number of concave portions 131 disposed per unit area may be more than that of the exemplary embodiment of FIG. 8. The number of concave portions 131 disposed per unit area is increased, thereby more improving the light extraction efficiency in the front of the organic light emitting display device through the concave portions 131.

And, in FIGS. 8 and 9, the vertical length L11 of the first emission area EA41 may be larger than the vertical length L12 of the second emission area EA42. Further, the horizontal length W31 of the first emission area EA41 may be substantially equal to the horizontal length W32 of the second emission area EA42. That is, the emission area of the first emission area EA41 may be larger than that of the second emission area EA42. Accordingly, the organic light emitting diode with low efficiency is disposed in the subpixel having a large emission area, thereby improving the lifespan of the organic light emitting diode.

Further, a diameter D1 of the first concave portion 131 of the first emission area EA41 may be larger than a diameter D2 of the second concave portion 331 of the second emission area EA42.

Figure 10:
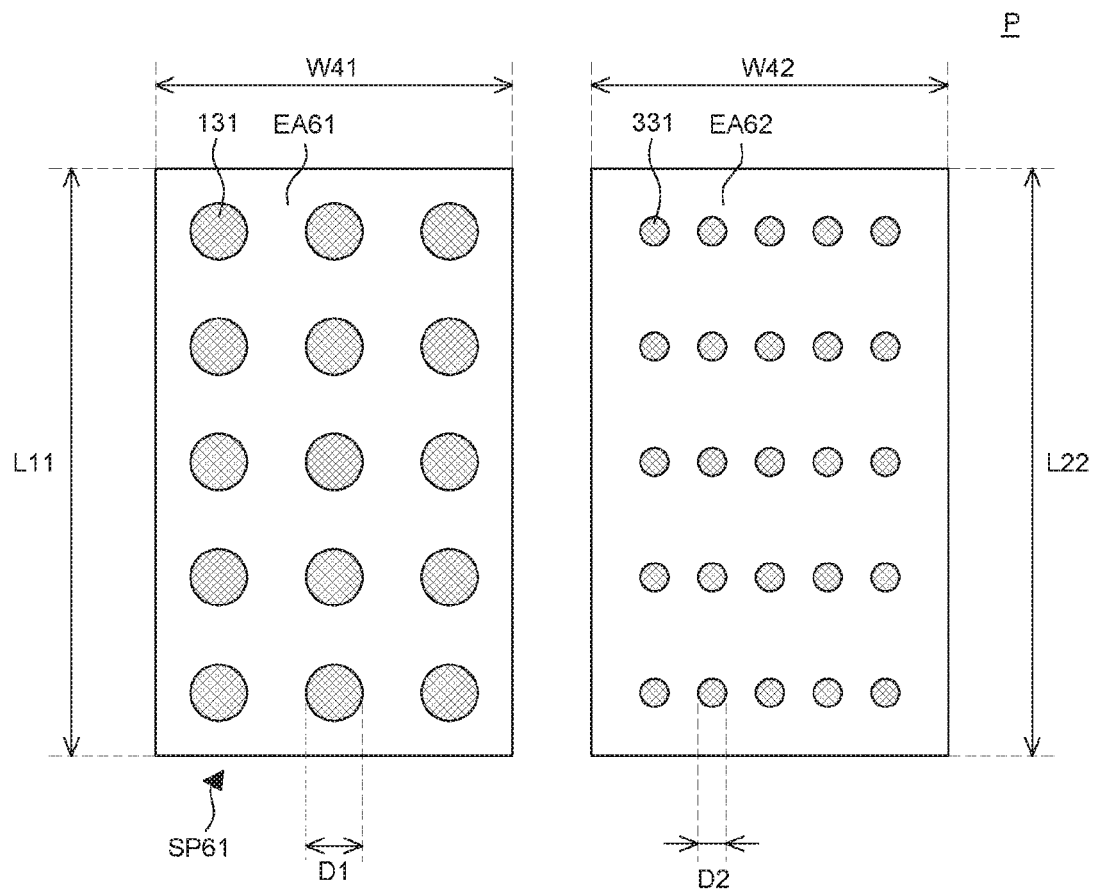
FIG. 10 is a plan view illustrating another shape in the emission areas of the organic light emitting display device according to the present disclosure.

The shapes of the first emission area EA41 and the second emission area EA42 according to the present disclosure are not limited thereto, and may be formed as illustrated in FIG. 10.

FIG. 10 is a plan view illustrating another shape in the emission areas of the organic light emitting display device according to the present disclosure.

Referring to FIG. 10, a vertical length L11 of a first emission area EA61 of the organic light emitting display device may be substantially equal to a vertical length L22 of a second emission area EA62, and a horizontal length W41 of the first emission area EA61 may be smaller than a horizontal length W42 of the second emission area EA62. That is, the emission areas of the emission areas may be adjusted by adjusting the horizontal lengths of the emission areas EA61 and EA62. Accordingly, the organic light emitting element with low efficiency is disposed in the subpixel having a large emission area, thereby improving the lifespan of the organic light emitting diode.

Such a configuration will be described below in detail with reference to FIG. 11.

Figure 11:
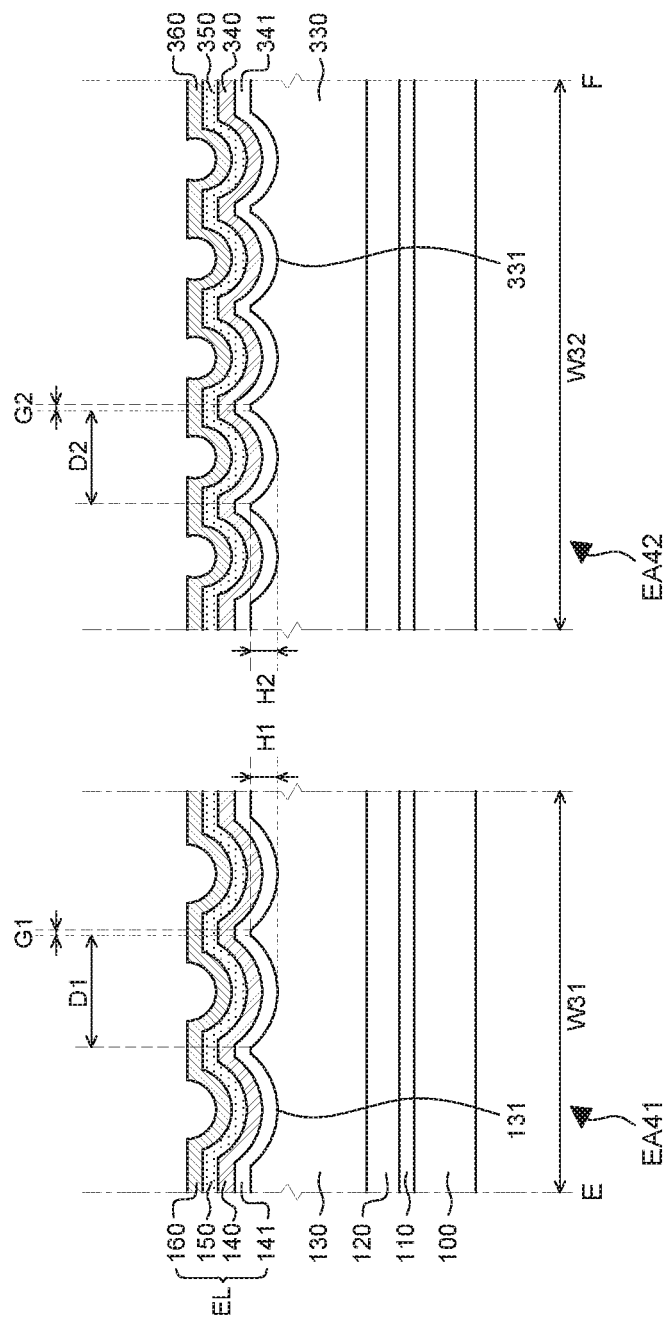
FIG. 11 is a cross-sectional view of a part of an emission area of an organic light emitting display device taken along line E-F according to a fourth exemplary embodiment of the present disclosure.

FIG. 11 is a cross-sectional view of a part of the emission area of the organic light emitting display device taken along line E-F according to the fourth exemplary embodiment of the present disclosure of FIG. 8.

Referring to FIG. 11, the organic light emitting display device according to the fourth exemplary embodiment of the present disclosure includes the first emission area EA41 and the second emission area EA42. In the first emission area EA41 and the second emission area EA42, protective layers 130 and 330 are disposed on the plurality of insulating layers 110 and 120, respectively.

In this case, a plurality of concave portions 131 and 331 are formed in the protective layers 130 and 330, respectively. A diameter D1 of the first concave portion 131 disposed in the first emission area EA41 may be larger than a diameter D2 of the second concave portion 331 disposed in the second emission area EA42. And, the horizontal length W31 of the first emission area EA41 may be equal to the horizontal length W32 of the second emission area EA42.

As such, the diameter D2 of the second concave portion 331 is smaller than the diameter D1 of the first concave portion 131 and the horizontal length W31 of the first emission area EA41 is substantially equal to the horizontal length W32 of the second emission area EA42, and thus the second concave portions 331 may be disposed in the horizontal direction to be more densely than the first concave portions 131.

As a result, in the second emission area EA42, the number of times when the light generated from the organic emission layer 350 disposed on the protective layer 330 with the plurality of second concave portions 331 may meet the plurality of second concave portions 331 may be increased.

Accordingly, in the second emission area EA42, the color shift with respect to a viewing angle can be decreased.

And, a change in optical path length according to the shape of the concave portions 131 and 331 of the protective layers 130 and 330 is a main factor capable of decreasing the color shift with respect to a viewing angle. As parameters of determining the shape of the protective layer, a diameter D of the concave portions 131 and 331 formed on the protective layers 130 and 330, a height H, and a gap G between the concave portions 131 and 331 and the adjacent concave portions 131 and 331, and the like are included.

Herein, the diameters D1 and D2 of the concave portions 131 and 331 formed in the first emission area EA41 and the second emission area EA42 may be formed in a range of 2 μm to 6 μm. When the diameters D1 and D2 of the concave portions 131 and 331 are less than 2 μm, it is difficult to form the concave portions due to the process. Further, when the diameters D1 and D2 of the concave portions 131 and 331 are more than 6 μm, the color shift with respect to a viewing angle may be largely generated through the concave portions in the emission areas.

Accordingly, the diameters D1 and D2 of the concave portions 131 and 331 are 2 μm to 6 μm, thereby decreasing the color shift with respect to a viewing angle.

Further, the heights H1 and H2 of the concave portions 131 and 331 formed in the first emission area EA41 and the second emission area EA42 may be formed in a range of 0.05 μm to 2 μm. When the heights H1 and H2 of the concave portions 131 and 331 are less than 0.05 μm, the heights H1 and H2 of the concave portions are too low, and thus the reflective layers 141 and 341 disposed on the concave portions 131 and 133 may be formed to be substantially flat. Accordingly, when the light emitted from the organic light emitting element 350 meets the reflective layers 141 and 341, the light meets the substantially flat surface, and thus the effect is the same as the case where the concave portions 131 and 331 are not formed on the protective layers 130 and 330. Further, when the heights H1 and H2 of the concave portions 131 and 331 are more than 2 μm, the color shift with respect to a viewing angle may be largely generated.

Accordingly, the heights H1 and H2 of the concave portions 131 and 331 are 0.05 μm to 2 μm, thereby decreasing the color shift with respect to a viewing angle.

In addition, the gaps G1 and G2 between the concave portions 131 and 331 formed in the first emission area EA41 and the second emission area EA42 and other adjacent concave portions 131 and 331 may be for example, 1 μm to 2 μm. When the gaps G1 and G2 are less than 1 μm, there is difficulty in the process of forming the concave portions 131 and 331, and when the gaps G1 and G2 are more than 2 μm, the color shift with respect to a viewing angle may be largely generated.

Accordingly, the gaps G1 and G2 between the concave portions 131 and 331 and other adjacent concave portions 131 and 331 are 1 μm to 2 μm, thereby decreasing the color shift depending on a viewing angle.

The organic light emitting display device according to the fourth exemplary embodiment adjusts the diameters and the heights of the plurality of concave portions 131 and 331 formed in the respective emission areas, and the gaps between the concave portions 131 and 331 and other adjacent concave portions 131 and 331. Accordingly, it is possible to decrease the color shift with respect to a viewing angle for each emission area of the organic light emitting display device.

And, in the organic light emitting display device in which three subpixels configure one pixel, an example to which the aforementioned emission areas are applied will be described below.

Figure 12:
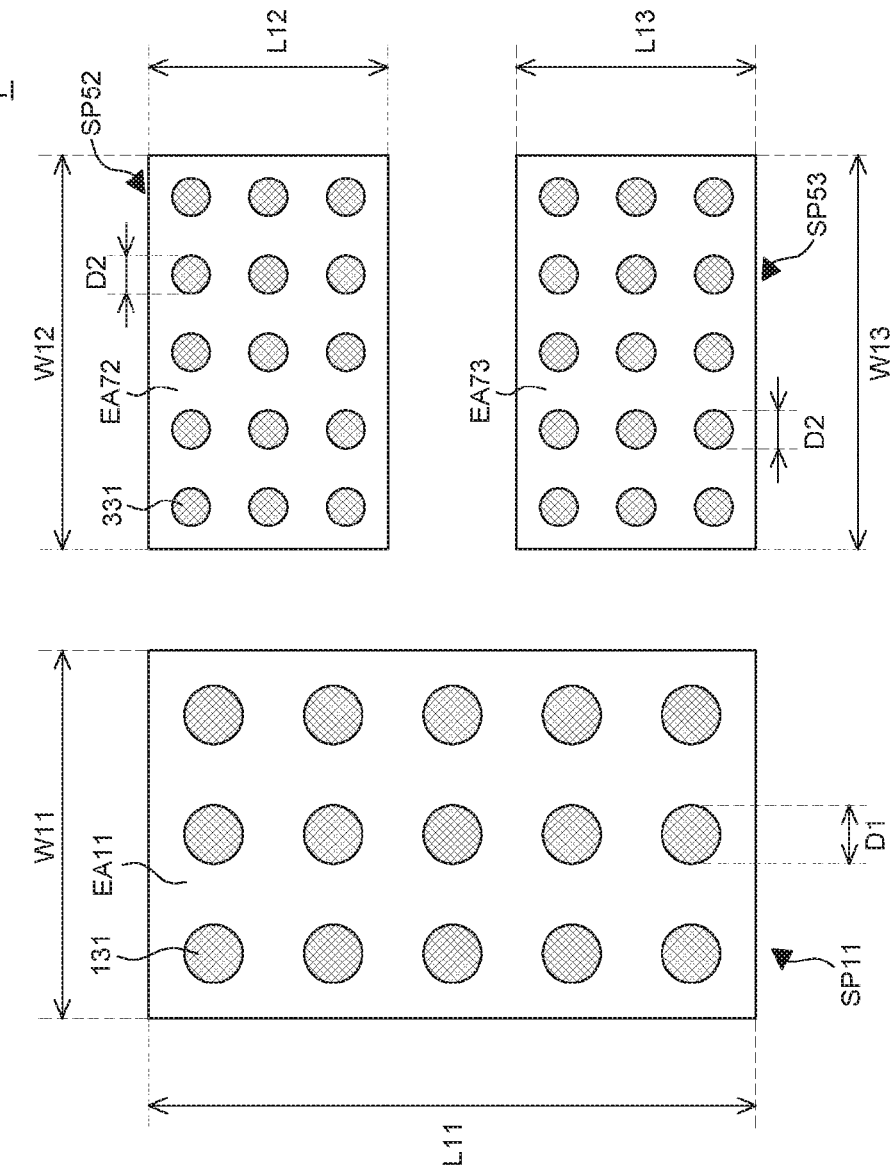
FIG. 12 is a plan view illustrating an emission area of an organic light emitting display device according to a fifth exemplary embodiment of the present disclosure.

FIG. 12 is a plan view illustrating an emission area of an organic light emitting display device according to a fifth exemplary embodiment of the present disclosure. The organic light emitting display device according to the fifth exemplary embodiment of the present disclosure may include the same components as the aforementioned exemplary embodiments. The description duplicated with the aforementioned exemplary embodiments may be omitted or may be brief below. Further, like components have like reference numerals.

Referring to FIG. 12, in the organic light emitting display device according to the fifth exemplary embodiment of the present disclosure, one pixel P includes a first subpixel SP11, a second subpixel SP52, and a third subpixel SP53. The first subpixel SP11, the second subpixel SP52, and the third subpixel SP53 include a first emission area EA11, a second emission area EA72, and a third emission area EA73.

The first emission area EA11, the second emission area EA72, and the third emission area EA73 include a plurality of concave portions 131 and 331, respectively. In this case, diameters D1 of the concave portions 131 of the first emission area EA11 may be larger than diameters D2 of the concave portions 331 of the second emission area EA72 and the third emission area EA73.

As a result, the diameters of the concave portions constituted by the plurality of concave portions 131 and 331 are adjusted, thereby decreasing the color shift with respect to a viewing angle for each emission area of the organic light emitting display device. And, in FIG. 12, the configuration in which the diameter D1 of the concave portions 131 disposed in the first emission area EA11 is larger than the diameters D2 of the concave portions 331 disposed in the second emission area EA72 and the third emission area EA73 is described, but the organic light emitting display device according to the fifth exemplary embodiment of the present disclosure is not limited thereto. The diameters D1 of the concave portions 131 of the first emission area EA11 may be smaller than the diameters D2 of the concave portions 331 of the second emission area EA72 and the third emission area EA73.

Figure 13:
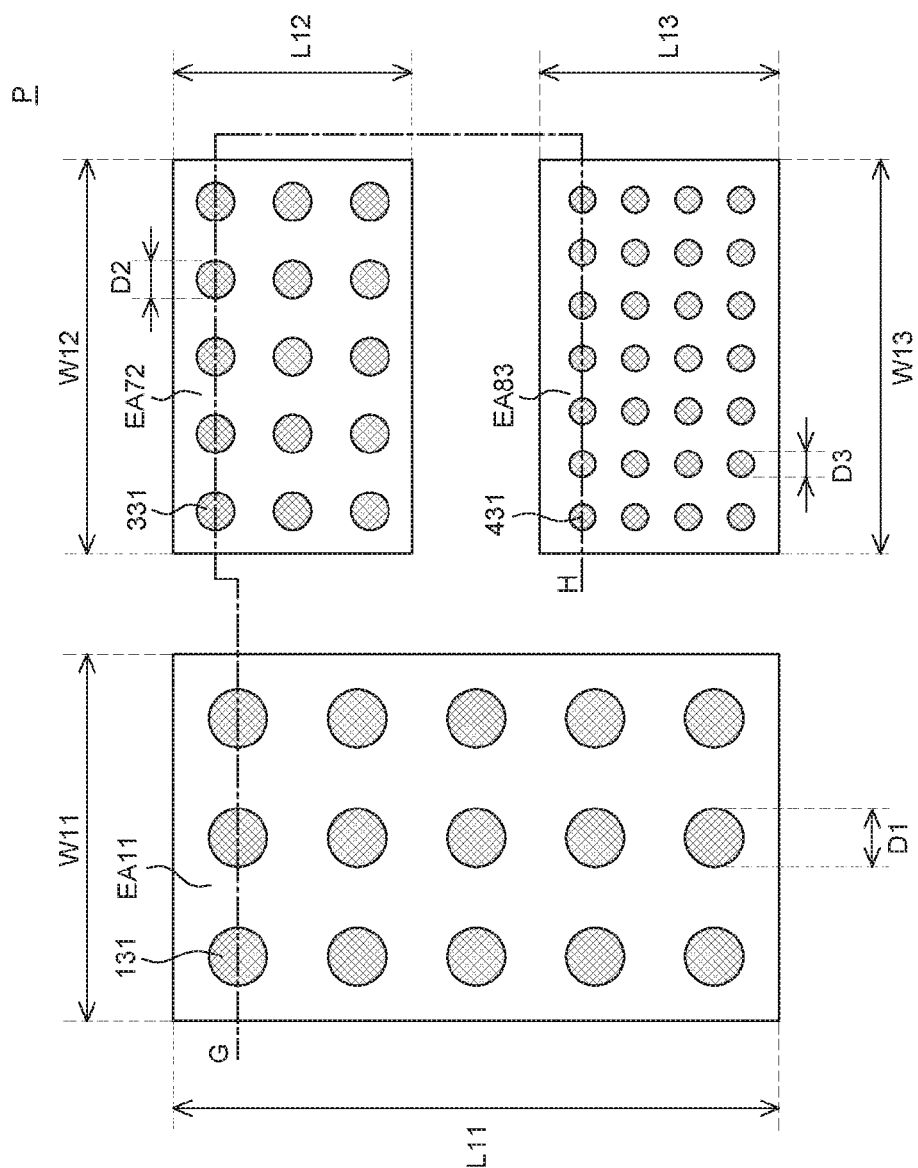
FIG. 13 is a plan view illustrating an organic light emitting display device including a plurality of concave portions having different diameters for each emission area.

Further, the diameters D2 of the concave portions 331 of the second emission area EA72 and the third emission area EA73 may be substantially equally formed, but the present disclosure is not limited thereto and may be formed as illustrated in FIG. 13.

FIG. 13 is a plan view illustrating an organic light emitting display device including a plurality of concave portions having different diameters for each emission area.

Referring to FIG. 13, diameters D1 of a plurality of concave portions 131 disposed in a first emission area EA11 may be larger than diameters D2 of a plurality of concave portions 331 disposed in a second emission area EA72. The diameters D2 of the plurality of concave portions 331 disposed in the second emission area EA72 may be larger than diameters D3 of a plurality of concave portions 431 disposed in a third emission area EA83.

That is, the diameters D1, D2, and D3 of the plurality of concave portions 131, 331, and 431 disposed in the first emission area EA11, the second emission area EA72, and the third emission area EA83 may be different from each other.

And, FIG. 13 illustrates the configuration in which the diameters D1 of the plurality of concave portions 131 disposed in the first emission area EA11 are larger than the diameters D2 of the plurality of concave portions 331 disposed in the second emission area EA72 and the diameters D2 of the plurality of concave portions 331 disposed in the second emission area EA72 are larger than diameters D3 of the plurality of concave portions 431 disposed in the third emission area EA83. However, the exemplary embodiment of the present disclosure is not limited thereto, and the diameters of the plurality of concave portions 131, 331, and 431 disposed in the first emission area EA11, the second emission area EA72, and the third emission area EA83 may be different from each other.

Accordingly, in the respective emission areas where the organic light emitting diodes emitting light having different colors, considering the color shift with respect to a viewing angle and light efficiency on the front of each organic light emitting diode, the diameters and the arrangement structure of the plurality of concave portions are adjusted. Thus, the color shift with respect to a viewing angle and the light extraction efficiency on the front can be improved.

Such a structure will be described below in detail with reference to FIG. 14.

Figure 14:
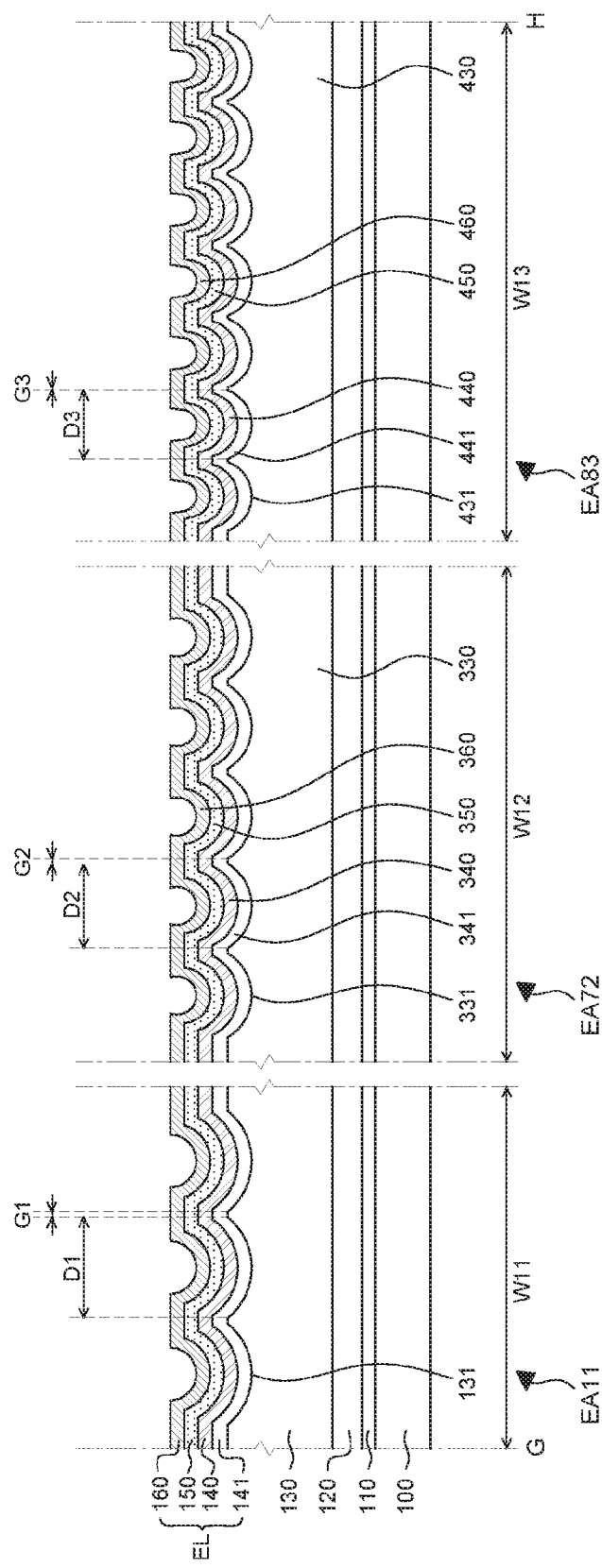
FIG. 14 is a cross-sectional view of the emission area of the organic light emitting display device of FIG. 13 taken along line G-H.

FIG. 14 is a cross-sectional view of the emission area of the organic light emitting display device of FIG. 13 taken along line G-H.

Referring to FIG. 14, the protective layers 130, 330, and 430 including the plurality of concave portions 131, 331, and 431 are included in the first emission area EA11, the second emission area EA72, and the third emission area EA83, respectively.

In this case, the concave portion 131 in the first emission area EA11 is disposed to be adjacent to other concave portions 131 at a predetermined gap G1. The concave portion 331 in the second emission area EA72 is disposed to be adjacent to other concave portions 331 at a predetermined gap G2. Further, the concave portion 431 in the third emission area EA83 is disposed to be adjacent to other concave portions 431 at a predetermined gap G3.

In this case, the diameter D1 of the concave portion 131 in the first emission area EA11 may be larger than diameter D2 of the concave portion 331 disposed in the second emission area EA72. The diameter D2 of the concave portion 331 in the second emission area EA72 may be larger than the diameter D3 of the concave portion 431 in the third emission area EA83.

In addition, the shapes of the organic light emitting diodes EL disposed in the respective emission areas EA11, EA72, and EA83 may be formed according to the shapes of the concave portions 131, 331, and 431 disposed in the respective emission areas EA11, EA72, and EA83.

As such, the plurality of concave portions 131, 331, and 431 are formed in the first emission area EA11, the second emission area EA72, and the third emission area EA83, thereby improving the color shift with respect to a viewing angle. Further, the plurality of concave portions 131, 331, and 431 having different diameters are included in the respective emission areas EA11, EA72, and EA83, thereby varying light extraction efficiency characteristic in the front for each of the emission areas EA11, EA72, and EA83.

Next, an emission area of an organic light emitting display device according to a sixth exemplary embodiment of the present disclosure will be described below.

Figure 15:
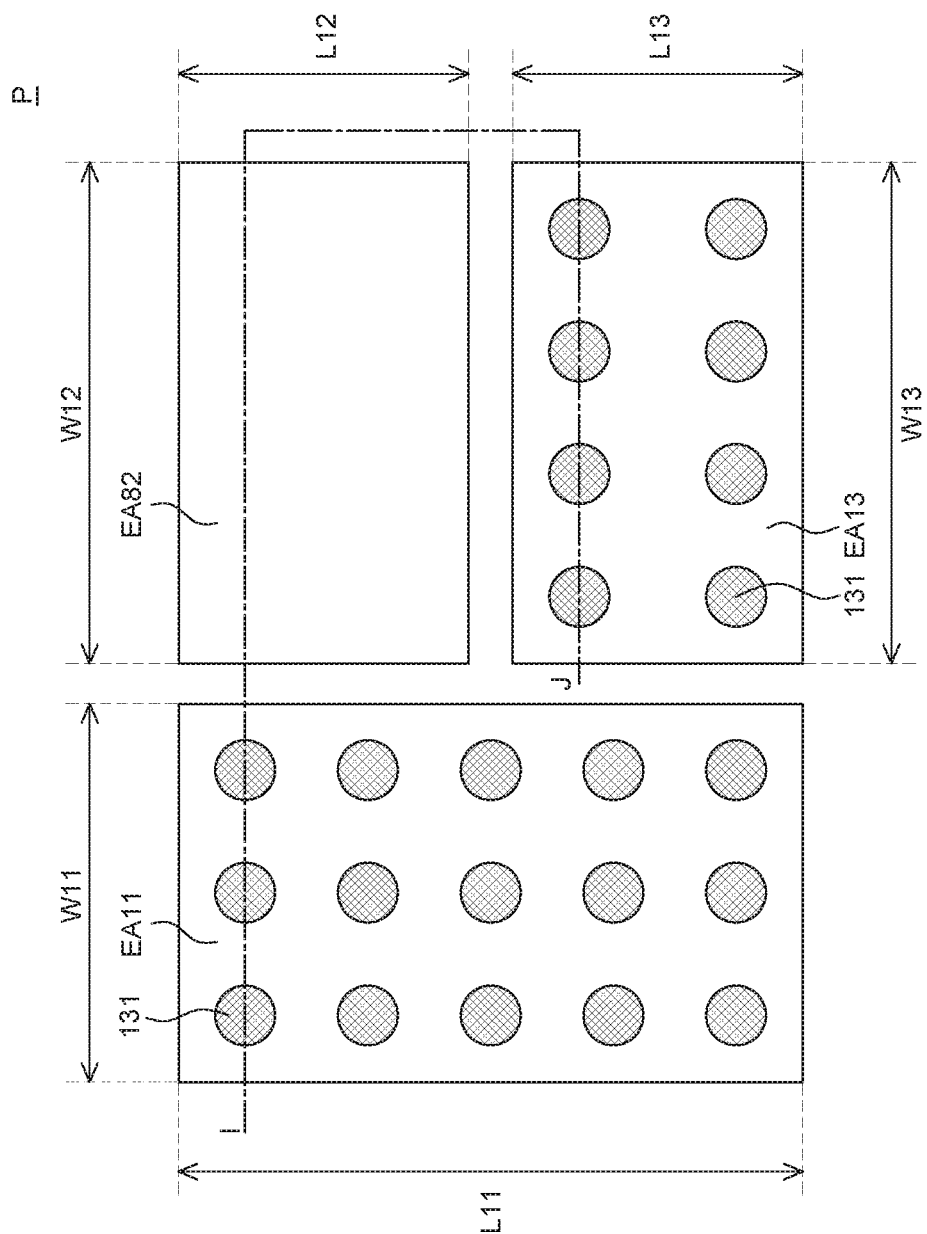
FIG. 15 is a plan view illustrating an emission area of an organic light emitting display device according to a sixth exemplary embodiment of the present disclosure.

FIG. 15 is a plan view illustrating an emission area of an organic light emitting display device according to a sixth exemplary embodiment of the present disclosure. The organic light emitting display device according to the sixth exemplary embodiment of the present disclosure may include the same components as the aforementioned exemplary embodiments. The description duplicated with the aforementioned exemplary embodiments may be omitted or may be brief below. Further, like components have like reference numerals.

Referring to FIG. 15, the emission area of the organic light emitting display device according to the sixth exemplary embodiment of the present disclosure may be divided into a first emission area EA11, a second emission area EA82, and a third emission area EA13. In this case, the first emission area EA11, the second emission area EA82, and the third emission area EA13 may emit light of different colors.

Further, the first emission area EA11 and the third emission area EA13 may include a plurality of concave portions 131 and the second emission area EA82 may not include the concave portions.

Such a configuration will be described below in detail with reference to FIG. 16.

Figure 16:
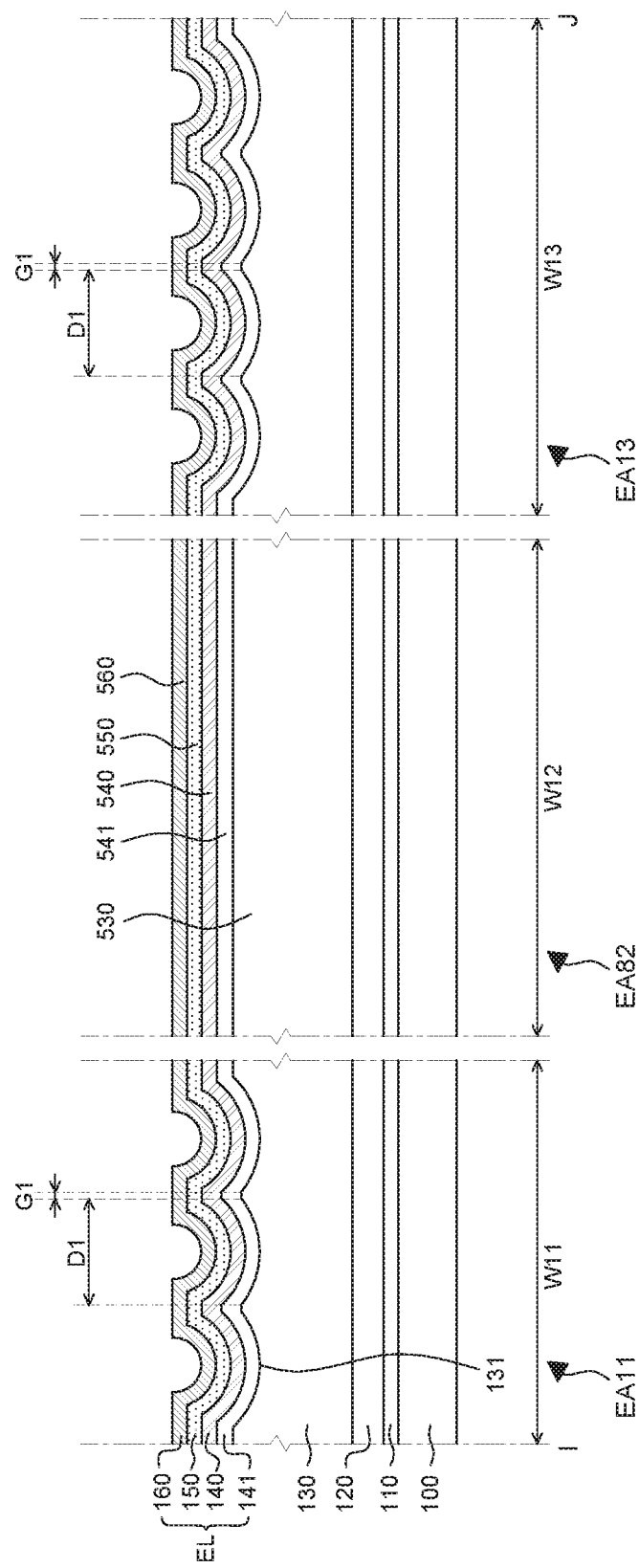
FIG. 16 is a cross-sectional view of the emission area of the organic light emitting display device taken along line I-J according to the sixth exemplary embodiment of the present disclosure.

FIG. 16 is a cross-sectional view of the emission area of the organic light emitting display device taken along line I-J according to the sixth exemplary embodiment of the present disclosure.

Referring to FIG. 16, in the first emission area EA11 and the third emission area EA13 of the organic light emitting display device according to the sixth exemplary embodiment of the present disclosure, the plurality of concave portions 131 is formed on the protective layer 130, and in the second emission area EA82, a protective layer 530 may be flatly formed. Accordingly, a reflective layer 541 and organic light emitting diodes 540, 550, and 560 disposed on the protective layer 530 may also be flatly formed.

As such, the first emission area EA11 and the third emission area EA13 include the plurality of concave portions 131 and the second emission area EA82 is flatly formed, thereby improving light efficiency in the front of the organic light emitting display device.

In detail, in the emission area with low light efficiency on the front of the organic light emitting display device, the protective layer is flatly formed, thereby improving the light efficiency on the front. In the emission area requiring the improvement for the color shift with respect to a viewing angle, the plurality of concave portions is formed in the protective layer, thereby improving the color shift with respect to a viewing angle.

As such, in the organic light emitting display device according to the sixth exemplary embodiment, in the pixel including the plurality of subpixels, the viewing angle enhancement structure is not formed on the protective layer disposed in at least one subpixel among the plurality of subpixels, thereby improving the light efficiency on the front of the organic light emitting display device. In this case, in the sixth exemplary embodiment, as an example of the viewing angle enhancement structure, the concave portions are described, but are not limited thereto.

Next, an organic light emitting display device according to a seventh exemplary embodiment of the present disclosure will be described below.

Figure 17:
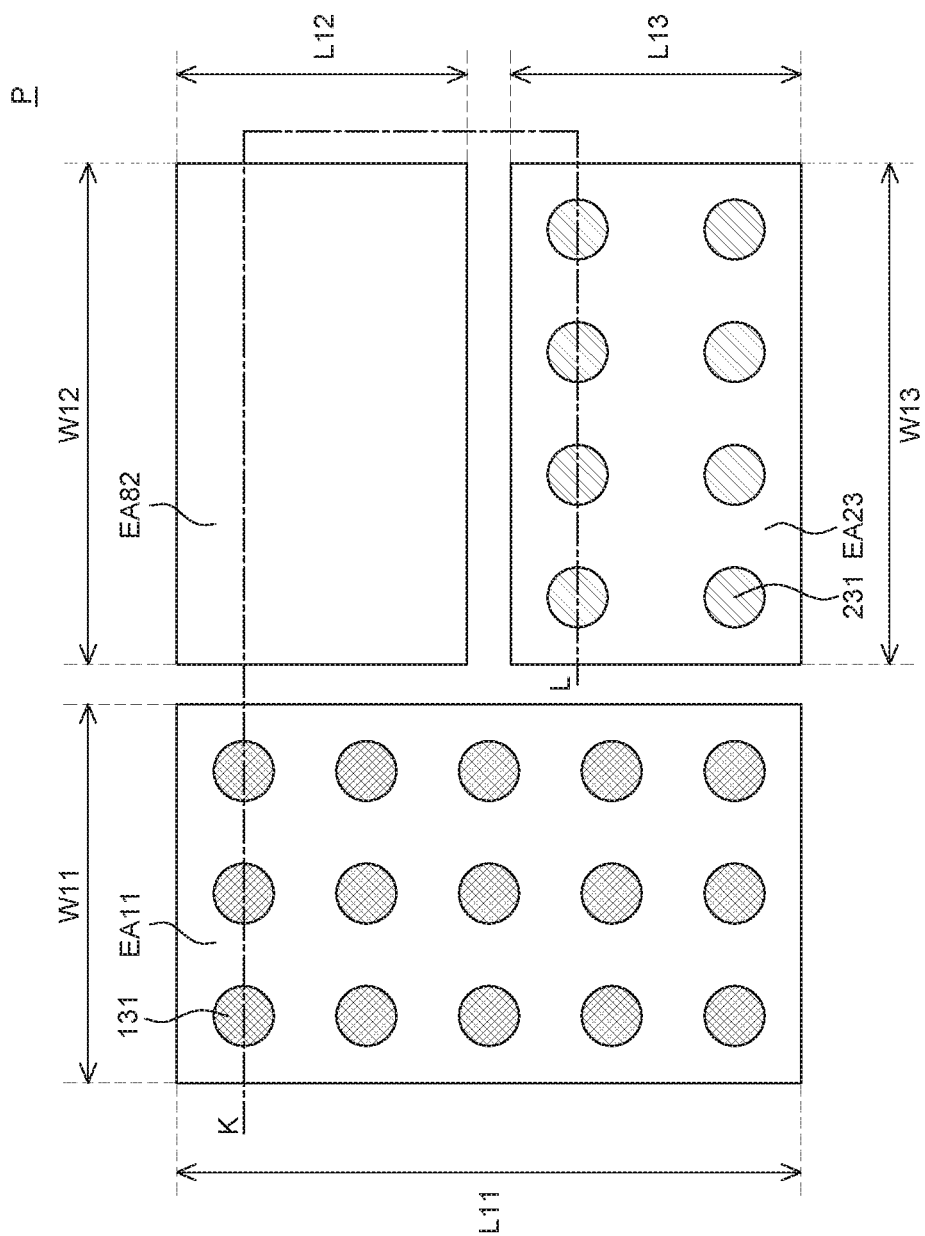
FIG. 17 is a plan view illustrating an emission area of an organic light emitting display device according to a seventh exemplary embodiment of the present disclosure.

FIG. 17 is a plan view illustrating an emission area of an organic light emitting display device according to a seventh exemplary embodiment of the present disclosure. The organic light emitting display device according to the seventh exemplary embodiment of the present disclosure may include the same components as the aforementioned exemplary embodiments. The description duplicated with the aforementioned exemplary embodiments may be omitted or may be brief below. Further, like components have like reference numerals.

Referring to FIG. 17, the organic light emitting display device according to the seventh exemplary embodiment of the present disclosure includes a first emission area EA11, a second emission area EA82, and a third emission area EA23. In this case, the first emission area EA11 may include a plurality of concave portions 131, but the second emission area EA82 may not include the concave portions 131. Further, the third emission area EA23 may include a plurality of convex portions 231. Such a configuration will be described below in detail with reference to FIG. 18.

Figure 18:
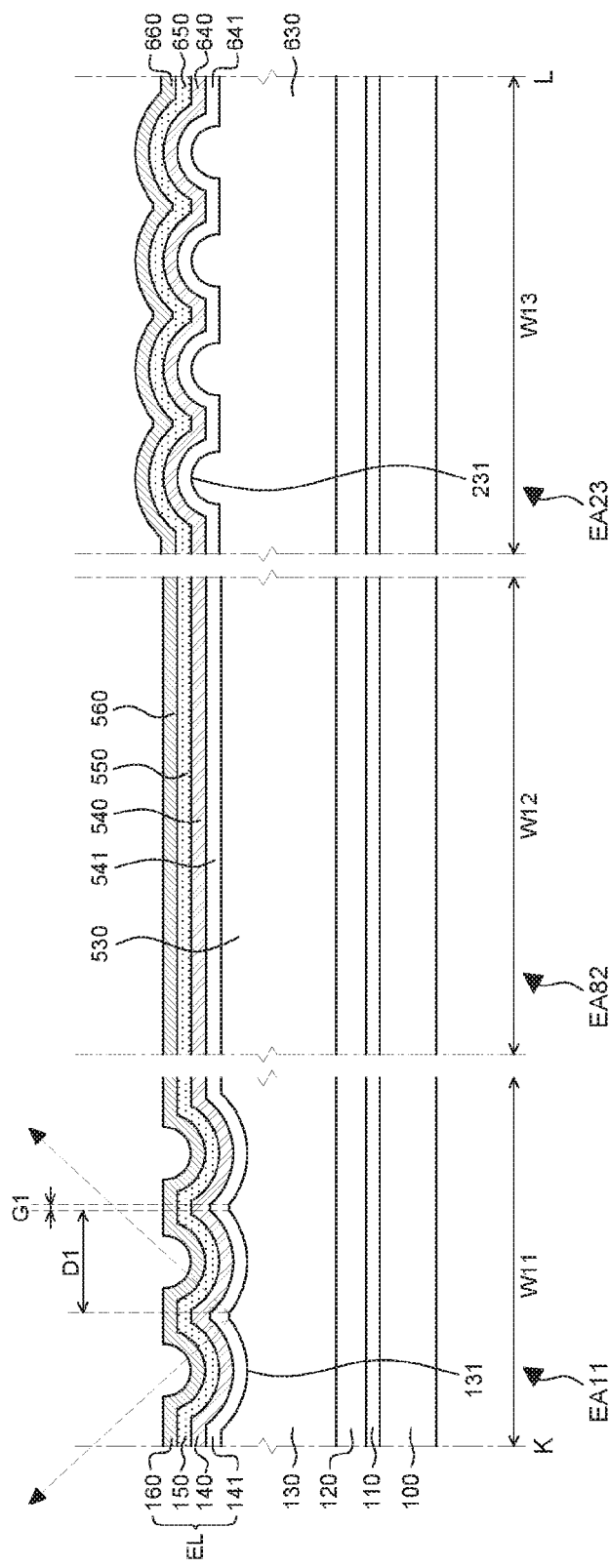
FIG. 18 is a cross-sectional view of the emission area of the organic light emitting display device taken along line K-L according to the seventh exemplary embodiment of the present disclosure.

FIG. 18 is a cross-sectional view of the organic light emitting display device taken along line K-L according to the seventh exemplary embodiment of the present disclosure.

Referring to FIG. 18, the first emission area EA11 of the organic light emitting display device according to the seventh exemplary embodiment of the present disclosure includes the plurality of concave portions 131 formed on the protective layer 130, and the second emission area EA82 includes a protective layer 530 which is flatly formed. And, the third emission area EA23 may include the plurality of convex portions 231.

As such, the first emission area EA11 includes the plurality of concave portions 131, the third emission area EA23 includes the plurality of convex portions 231, and the second emission area EA82 is flatly formed, thereby improving light efficiency in the front of the organic light emitting display device.

In detail, in the emission area with low light efficiency on the front of the organic light emitting display device, the protective layer is flatly formed, thereby improving the light efficiency on the front. In the emission area requiring the improvement for the color shift with respect to a viewing angle, the plurality of concave portions or the plurality of convex portions is formed in the protective layer, thereby improving the color shift with respect to a viewing angle.

As such, in the organic light emitting display device according to the seventh exemplary embodiment, in the pixel including the plurality of subpixels, the viewing angle enhancement structure is not included in the protective layer disposed in at least one subpixel among the plurality of subpixels, thereby improving the light efficiency on the front of the organic light emitting display device. In addition, in the seventh exemplary embodiment, as an example of the viewing angle enhancement structure, the plurality of concave portions 131 and the plurality of convex portions 231 are described above, but are not limited thereto.

In the exemplary embodiment of the present disclosure, in each emission area, the plurality of concave portions or the plurality of convex portions is formed on the protective layer, or the protective layer is flatly formed. That is, a configuration in which the plurality of concave portions or the plurality of convex portions is not disposed on the protective layer may be applied in combination thereof. For example, the present disclosure may be achieved as illustrated in FIGS. 19 and 20.

Figure 19:
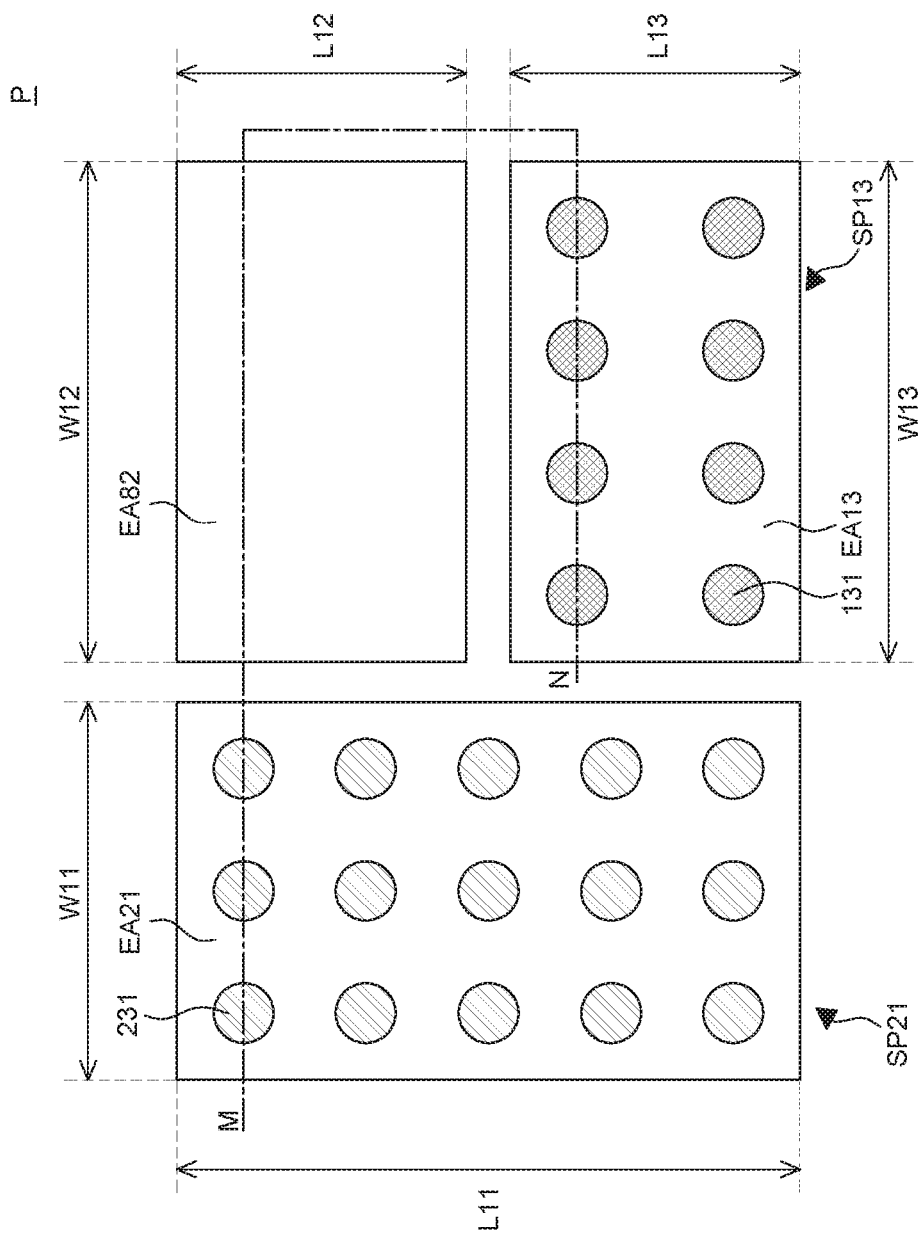
FIG. 19 is a plan view illustrating the emission area of the organic light emitting display device according to an exemplary embodiment extended based on the seventh exemplary embodiment of the present disclosure.

FIG. 19 is a plan view illustrating the emission area of the organic light emitting display device according to an exemplary embodiment extended based on the seventh exemplary embodiment of the present disclosure. FIG. 20 is a cross-sectional view taken along line M-N of the plan view of FIG. 19.

Figure 20:
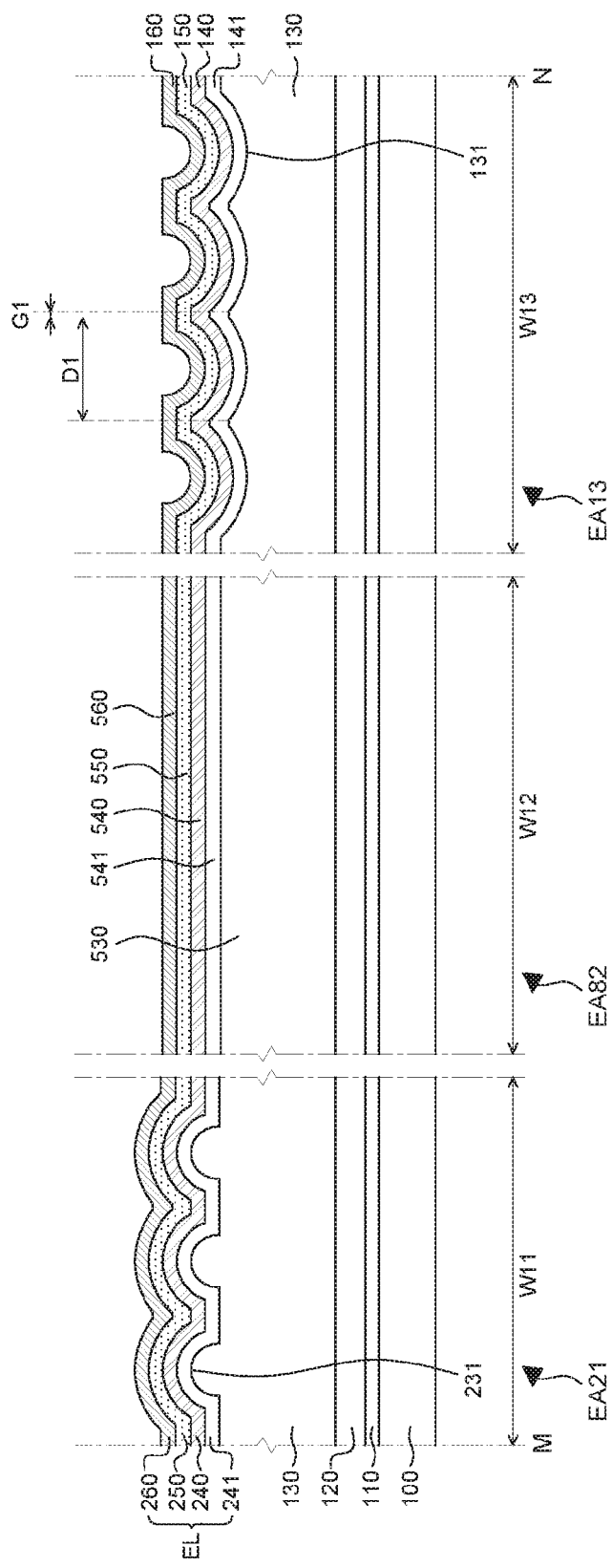
FIG. 20 is a cross-sectional view taken along line M-N of the plan view of FIG. 19.

Referring to FIGS. 19 and 20, the first emission area EA21 includes the plurality of convex portions 231 and the third emission area EA13 includes the plurality of concave portions 131. In addition, the protective layer 530 disposed in the second emission area EA82 and the organic light emitting elements 540, 550, and 560 may be flatly formed. As a result, the light efficiency on the front of the organic light emitting display device and the color shift with respect to a viewing angle for each emission area may be adjusted.

As described above, in the organic light emitting display device according to the present disclosure, the emission area includes the plurality of concave portions or convex portions, or the plurality of concave portions or convex portions is included only in a part of the emission area, thereby simultaneously improving the light efficiency on the front of the organic light emitting display device and the color shift with respect to a viewing angle.

Hereinabove, the size and the shape of the emission area included in each subpixel, and the size, the height, the gap, and the like of the concave portion or the convex portion included in the emission area are described. Hereinafter, a bank layer defining the emission area of each subpixel and the concave portion or the convex portion included in the emission area will be described in detail.

Figure 21:
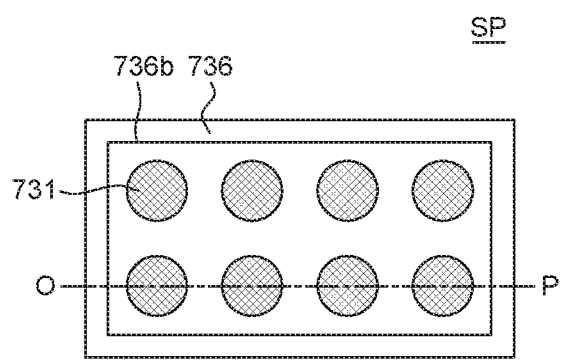
FIG. 21 is a plan view illustrating an emission area of an organic light emitting display device according to an eighth exemplary embodiment of the present disclosure.

FIG. 21 is a plan view illustrating an emission area of an organic light emitting display device according to an eighth exemplary embodiment of the present disclosure.

Referring to FIG. 21, each subpixel SP included in the organic light emitting display device according to the eighth exemplary embodiment of the present disclosure forms a bank layer 736 including an opening 736b defining the emission area, and a plurality of concave portions 731 which is spaced apart from each other at regular intervals in the emission area. The opening 736b may have a predetermine shape, for example, a quadrangular shape on the plane, but is not limited thereto. The plurality of concave portions 731 may be disposed in the emission area defined by the opening 736b.

Each subpixel SP including the concave portions 731 may be equal to or substantially equal to the subpixels described with reference to FIGS. 2 to 20.

Hereinafter, examples in which the viewing angle enhancement structure is configured by the concave portion and other examples in which the viewing angle enhancement structure is configured by the convex portion will be described.

Figure 22:
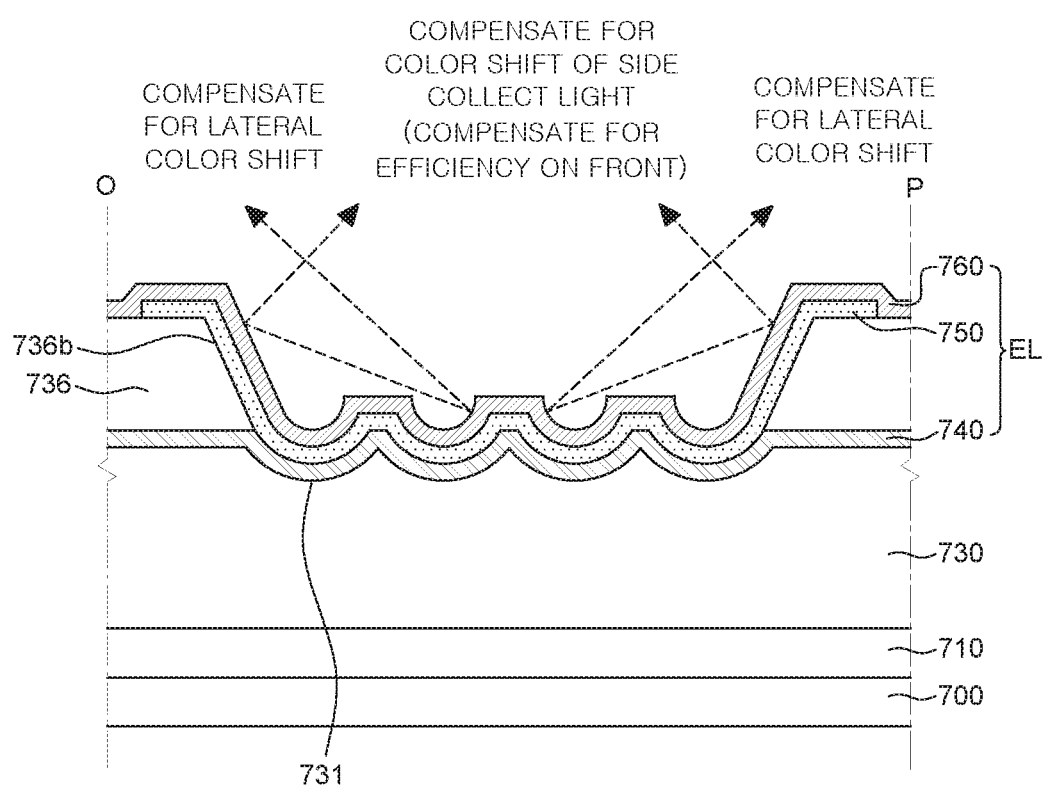
FIGS. 22 and 23 are cross-sectional views of the emission area of the organic light emitting display device taken along line O-P according to the eighth exemplary embodiment of the present disclosure.
Figure 23:
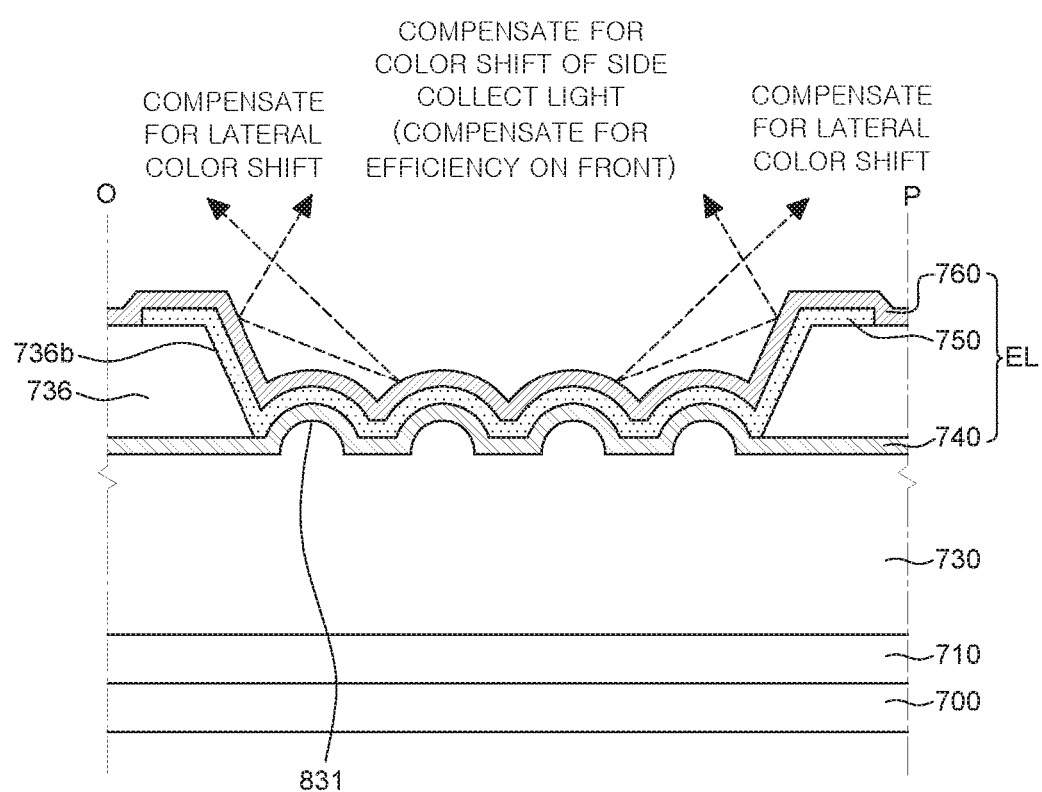

FIGS. 22 and 23 are cross-sectional views of the emission area of the organic light emitting display device taken along line O-P according to the eighth exemplary embodiment of the present disclosure.

Referring to FIG. 22, in each subpixel included in the organic light emitting display device of the eighth exemplary embodiment of the present disclosure, the insulating layer 710 and the protective layer 730 with the plurality of concave portions 731 are disposed on the substrate 700, and the organic light emitting element EL is disposed on the protective layer 730.

In detail, the protective layer 730 includes the viewing angle enhancement structure constituted by the plurality of concave portions 731 spaced apart from each other at regular intervals.

A first electrode 740, an organic emission layer 750, and a second electrode 760 of the organic emission element EL may be sequentially disposed on the protective layer 730. In this case, shapes of the first electrode 740, the organic emission layer 750, and the second electrode 760 may correspond to the shape of the concave portions 731 formed on the protective layer 730.

As described above, in the organic light emitting display device according to the eighth exemplary embodiment of the present disclosure, the plurality of concave portions 731 is provided in the emission area of each subpixel SP, thereby compensating for the color shift on the side of the organic light emitting display device.

Each subpixel SP included in the organic light emitting display device according to the eighth exemplary embodiment of the present disclosure is disposed on the protective layer 730 and the first electrode 740 and may further include a bank layer 736 including an inclined opening 736b exposing the first electrode 740. The second electrode 760 disposed on the bank layer 736 has the same shape as the bank layer 736. In this case, the light emitted from the organic emission layer 750 is reflected on the inclined opening 736b of the bank layer 736, particularly, the second electrode 760 disposed on the opening 736b of the bank layer 736 to be extracted to the front of the organic light emitting display device.

In other words, each subpixel SP compensates for the color shift on the side due to the plurality of concave portions 731 spaced apart from each other at regular intervals and the light emitted from the organic emission layer 750 is reflected on the second electrode 760 disposed on the inclined opening 736b of the bank layer 736 to be collected in the emission area, thereby improving the light efficiency on the front of the organic light emitting display device.

Referring to FIG. 22, each subpixel SP included in the organic light emitting display device according to the eighth exemplary embodiment of the present disclosure compensates for the color shift on the side due to the plurality of concave portions 731 spaced apart from each other at regular intervals and the light emitted from the organic emission layer 750 is reflected on the inclined opening 736b of the bank layer 736 to be collected in the emission area, thereby improving the light efficiency on the front of the organic light emitting display device. In this case, each subpixel SP includes a plurality of convex portions 831 spaced apart from each other at regular intervals, the bank layer 736, and the opening of the bank layer 736 as illustrated in FIG. 23 instead of the concave portions 731 illustrated in FIG. 22, thereby compensating for the color shift on the side and improving the light efficiency on the front of the organic light emitting display device.

As illustrated in FIGS. 22 and 23, a slope of the inclined opening 736b of the bank layer 736 is constant, and in this case, the slope of the opening 736b may be 40° or higher. In other words, the inclined angle of the opening 736b of the bank layer 736 may be 40° or higher. When the inclined angle of the opening 736b is less than 40°, the light emitted from the organic emission layer 750 is reflected on the second electrode 760 disposed on the inclined opening 736b of the bank layer 736 not to be collected in the emission area and may be emitted to the non-emission area, thereby deteriorating the light efficiency on the front.

Figure 24:
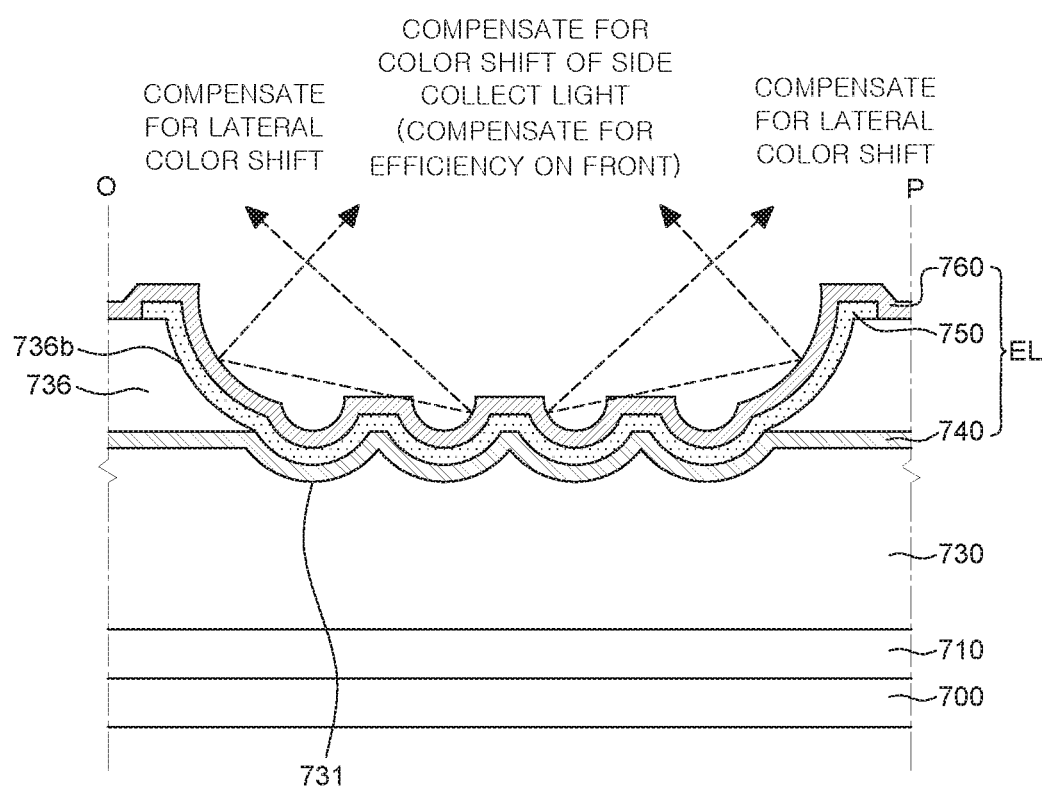
FIGS. 24 and 25 are cross-sectional views of the emission area of the organic light emitting display device taken along line O-P extended based on the eighth exemplary embodiment of the present disclosure.
Figure 25:
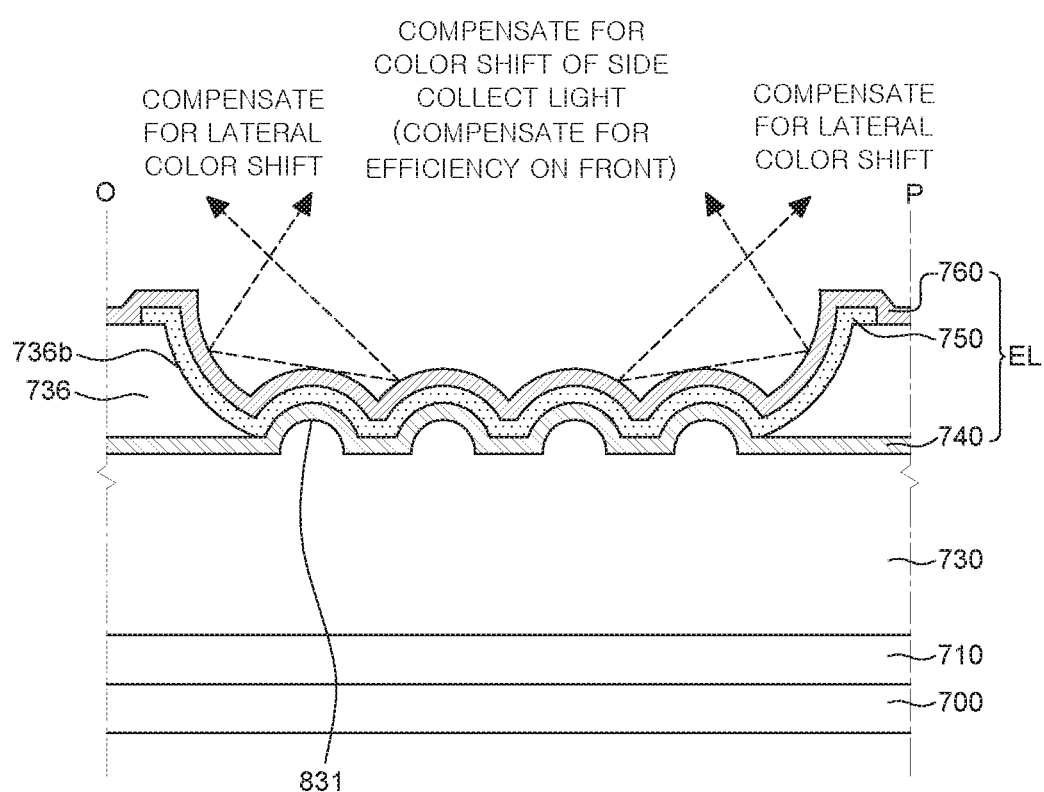

FIGS. 24 and 25 are cross-sectional views of the emission area of the organic light emitting display device taken along line O-P extended based on the eighth exemplary embodiment of the present disclosure.

As illustrated in FIGS. 24 and 25, the inclined opening 736b of the bank layer 736 may have a concave shape. In other words, when the slope of the opening 736b of the bank layer 736 is less than 40°, the opening 736b is concavely formed, thereby increasing collection light efficiency to the emission area.

Referring to FIG. 21, in each subpixel SP included in the organic light emitting display device according to the eighth exemplary embodiment of the present disclosure, the opening 736b has a predetermined shape, for example, a quadrangular shape on the plane, and the plurality of concave portions 731 is disposed in the emission area defined by the opening 736b. However, hereinafter, exemplary embodiments in which the opening is divided into two or more will be described.

Figure 26:
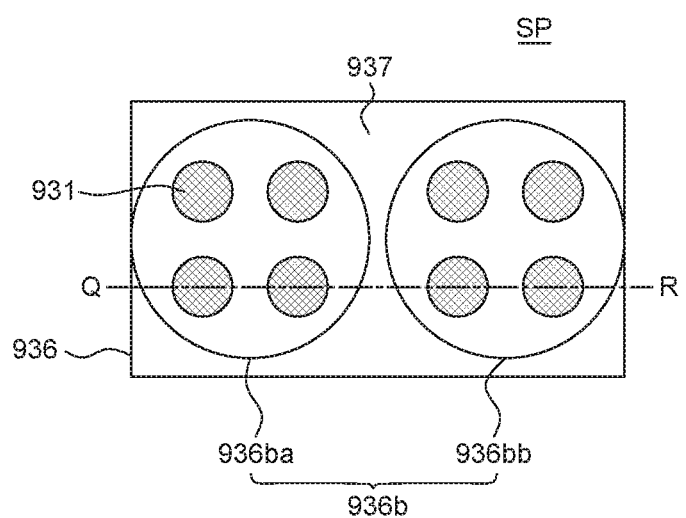
FIG. 26 is a plan view illustrating an emission area of an organic light emitting display device according to a ninth exemplary embodiment of the present disclosure.

FIG. 26 is a plan view illustrating an emission area of an organic light emitting display device according to a ninth exemplary embodiment of the present disclosure.

Referring to FIG. 26, each subpixel SP included in the organic light emitting display device according to the ninth exemplary embodiment of the present disclosure forms a bank layer 936 including an opening 936b defining the emission area, and a plurality of concave portions 931 which is spaced apart from each other at regular intervals in the emission area.

The opening 936b is divided into two or more, a partition wall 937 may be positioned between two or more openings 936b, and two or more concave portions 931 may be positioned in one opening 936ba or 936bb.

For example, as illustrated in FIG. 26, the openings 936b may be divided into a first opening 936ba and a second opening 936bb. The first opening 936ba and the second opening 936bb may have predetermined shapes, for example, circular, oval, or polygonal shapes on the plane, and a partition wall 937 may be disposed therebetween. In the first opening 936ba and the second opening 936bb, two or more concave portions, for example, four concave portions 931 may be positioned, respectively.

The first opening 936ba and the second opening 936bb have the same shape and area, and the numbers of concave portions positioned therein are the same as each other. However, the first opening 936ba and the second opening 936bb may have different shapes and areas and the numbers of concave portions positioned therein may be different from each other.

Each subpixel SP including the plurality of concave portions 931 spaced apart from each other at regular intervals may be equal to or substantially equal to the subpixels described with reference to FIGS. 2 to 20.

Figure 27:
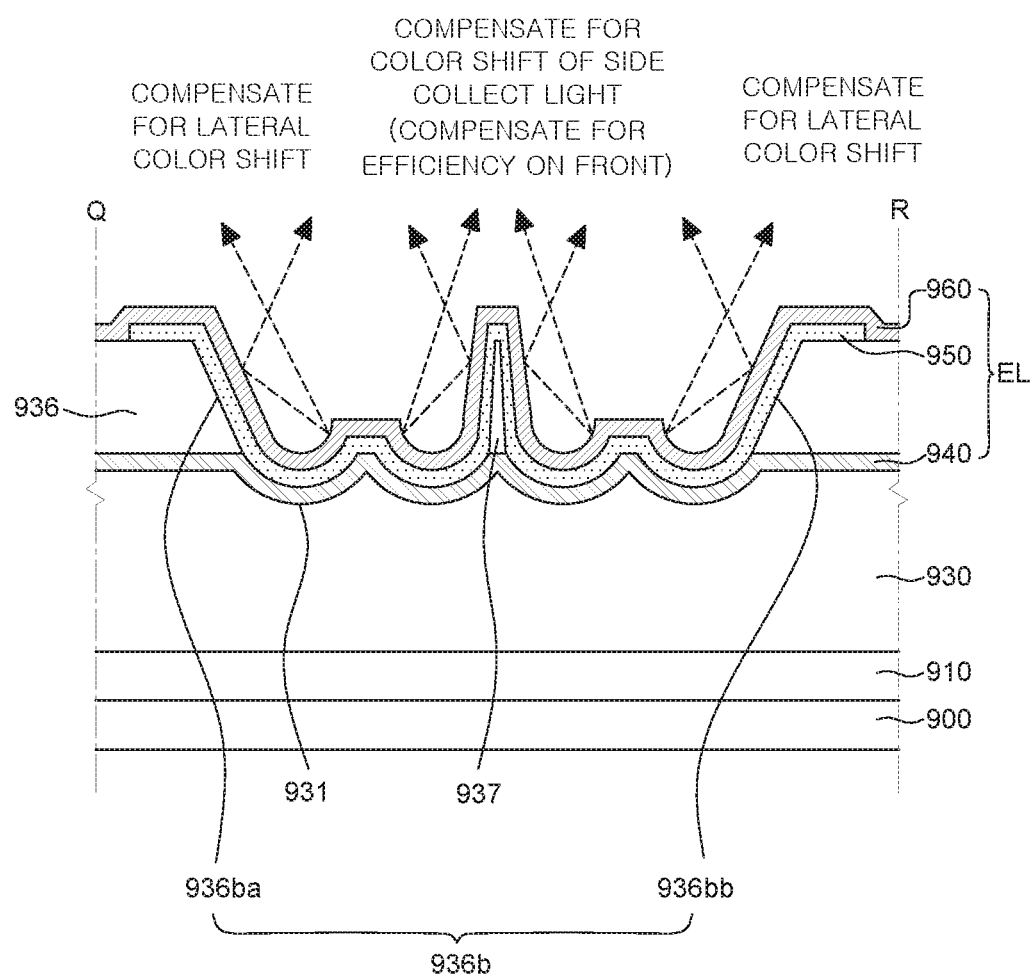
FIGS. 27 and 28 are cross-sectional views of the emission area of the organic light emitting display device taken along line Q-R according to the ninth exemplary embodiment of the present disclosure.
Figure 28:
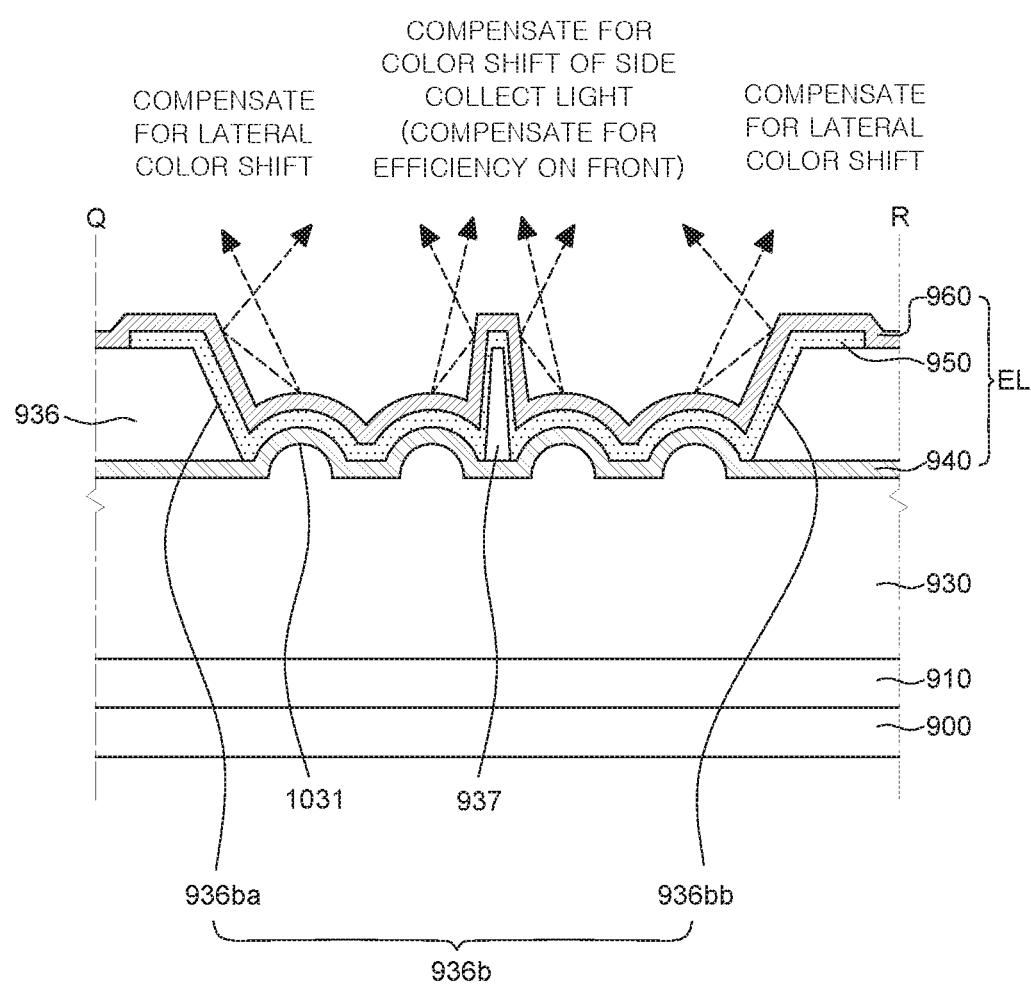

FIGS. 27 and 28 are cross-sectional views of the emission area of the organic light emitting display device taken along line Q-R according to the ninth exemplary embodiment of the present disclosure.

Referring to FIG. 27, in each subpixel SP included in the organic light emitting display device of the ninth exemplary embodiment of the present disclosure, the insulating layer 910 and the protective layer 930 with the plurality of concave portions 931 are disposed on the substrate 900, and the organic light emitting diode EL is disposed on the protective layer 930. In this case, the plurality of concave portions 931 may be spaced apart from each other at regular intervals.

A first electrode 940, an organic emission layer 950, and a second electrode 960 of the organic emission element EL may be sequentially disposed on the protective layer 930. In this case, shapes of the first electrode 940, the organic emission layer 950, and the second electrode 960 may correspond to the shape of the concave portions 931 formed on the protective layer 930.

Each subpixel SP included in the organic light emitting display device according to the ninth exemplary embodiment of the present disclosure is disposed on the protective layer 930 and the first electrode 940 and may further include a bank layer 936 including an inclined opening 936b exposing the first electrode 940.

As illustrated in FIG. 27, the openings 936b may be divided into a first opening 936ba and a second opening 936bb. The first opening 936ba and the second opening 936bb may have predetermined shapes, for example, circular, oval, or polygonal shapes on the plane, and a partition wall 937 may be disposed therebetween.

The partition wall 937 includes the same material as the bank layer 936 and may be formed simultaneously with the bank layer 936 by the same process as the bank layer 936.

The second electrode 960 disposed on the bank layer 936 has the same shape as the bank layer 936 and the partition wall 937. In this case, the light emitted from the organic emission layer 950 is reflected on the inclined opening 936b of the bank layer 936 and the partition wall 937, particularly, the second electrode 960 disposed on the opening 936b of the bank layer 936 and the partition wall 937 to be collected in the emission area.

Referring to FIG. 28, each subpixel SP may include a plurality of convex portions 1031 instead of the concave portions 931 illustrated in FIG. 27, the opening 936b of the bank layer 936, and the partition wall 937.

As described above, two or more openings 936b of the bank layer 936 are formed and the light emitted through the concave portions 931 or the convex portions 1031 is reflected on the partition walls, thereby improving light efficiency on the front of the organic light emitting display device.

As illustrated in FIGS. 27 and 28, a slope of the inclined opening 936b of the bank layer 936 is constant, and the slope of the opening 936b may be 40° or higher. Further, the opening 936b and the partition wall 937 may have concave shapes as illustrated in FIGS. 24 and 25. The concave shapes of the opening 936b and the partition wall 937 may improve the light efficiency to the front of the organic light emitting display device.

Figure 29:
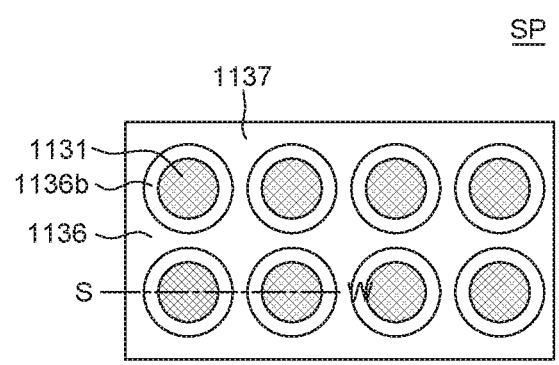
FIG. 29 is a plan view illustrating an emission area of an organic light emitting display device according to a tenth exemplary embodiment of the present disclosure.

FIG. 29 is a plan view illustrating an emission area of an organic light emitting display device according to a tenth exemplary embodiment of the present disclosure.

Referring to FIG. 29, each subpixel SP included in the organic light emitting display device according to the tenth exemplary embodiment of the present disclosure forms a bank layer 1136 including an opening 1136b defining an emission area, and a micro lens constituted by a plurality of concave portions 1131 which is disposed in the emission area.

The opening 1136b is divided into two or more, a partition wall 1137 may be positioned between two or more openings 1136b, and one concave portion 1131 may be positioned in one opening 1136b. Each opening 1136b may have a predetermined shape, for example, a circular, oval, or polygonal shape on the plane, and the partition wall 1137 may be positioned therebetween.

The openings 1136b have the same shape and area and the sizes or the shapes of the concave portions positioned therein are the same as each other, but the openings 1136b may have different shapes and areas and the sizes or the shapes of the concave portions positioned therein may be different from each other.

Each subpixel SP including the concave portions 1131 may be equal to or substantially equal to the subpixels described with reference to FIGS. 2 to 20.

Figure 30:
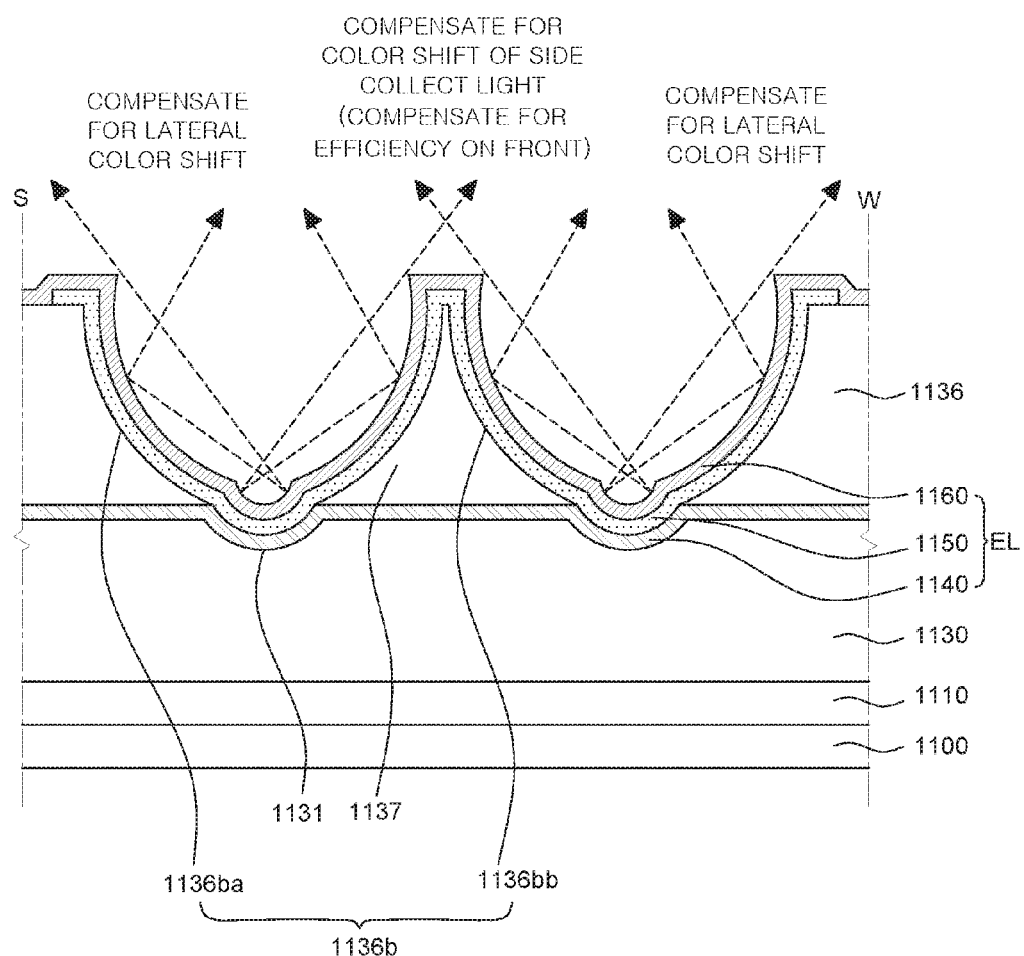
FIGS. 30 and 31 are cross-sectional views of the emission area of the organic light emitting display device taken along line S-W according to the tenth exemplary embodiment of the present disclosure.
Figure 31:
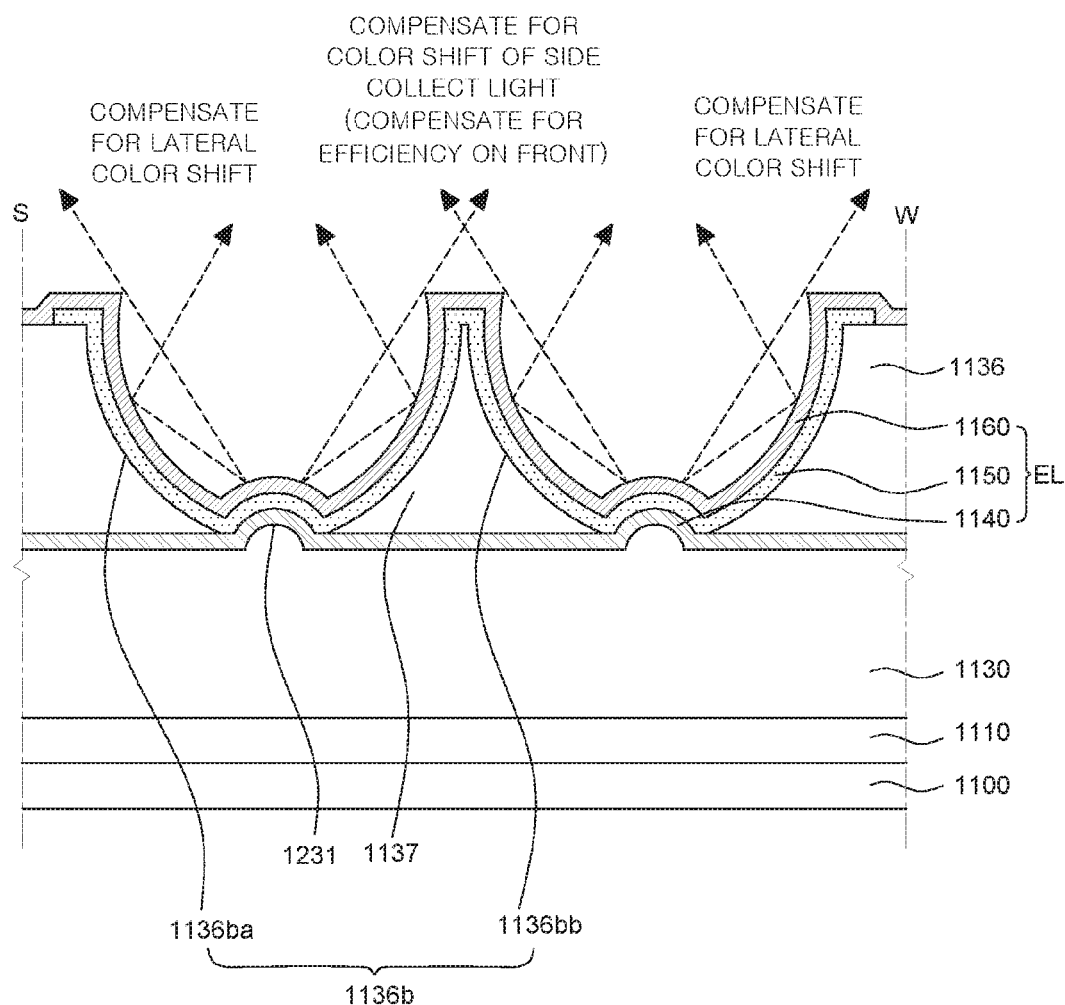

FIGS. 30 and 31 are cross-sectional views of the emission area of the organic light emitting display device taken along line S-W according to the tenth exemplary embodiment of the present disclosure.

Referring to FIG. 30, in each subpixel SP included in the organic light emitting display device of the tenth exemplary embodiment of the present disclosure, an insulating layer 1110 and a protective layer 1130 with a plurality of concave portions 1131 are disposed on a substrate 1100, and the organic light emitting element EL is disposed on the protective layer 1130.

Particularly, a first electrode 1140, an organic emission layer 1150, and a second electrode 1160 of the organic emission element EL may be sequentially disposed on the protective layer 1130. In this case, shapes of the first electrode 1140, the organic emission layer 1150, and the second electrode 1160 may correspond to the shape of the concave portions 1131 formed on the protective layer 1130.

Each subpixel SP included in the organic light emitting display device according to the tenth exemplary embodiment of the present disclosure is disposed on the protective layer 1130 and the first electrode 1140 and may further include a bank layer 1136 including an inclined opening 1136b exposing the first electrode 1140. Each opening 1136b may have a predetermined shape, for example, a circular shape, an oval shape, or a polygonal shape, and a partition wall 1137 may be positioned therebetween.

The partition wall 1137 includes the same material as the bank layer 1136 and may be formed simultaneously with the bank layer 1136 by the same process as the bank layer 1136.

The second electrode 1160 disposed on the bank layer 1136 has the same shape as the bank layer 1136 and the partition wall 1137. In this case, the light emitted from the organic emission layer 1150 is reflected on the inclined opening 1136b of the bank layer 1136 and the partition wall 1137, particularly, the second electrode 1160 disposed on the opening 1136b of the bank layer 1136 and the partition wall 1137 to be collected in the emission area.

Each subpixel SP includes convex portions 1231 illustrated in FIG. 31 instead of the concave portions 1131 illustrated in FIG. 30, an opening 1136b of the bank layer 1136, and a partition wall 1137, thereby improving a color shift on the side and light emitting efficiency on the front of the organic light emitting display device.

As illustrated in FIGS. 30 and 31, the inclined opening 1136b of the bank layer 1136 may have a concave shape. Alternatively, in the inclined opening 1136b of the bank layer 1136, as illustrated in FIGS. 27 and 28, the slope of the opening 1136b of the bank layer 1136 is constant, and the slope of the opening 1136b may be 40° or higher.

As described above, in the organic light emitting display device according to the present disclosure, the emission area includes the plurality of concave portions or convex portions and the emitted light is reflected on the inclined opening of the bank layer to be collected in the emission area, thereby simultaneously improving light efficiency on the front and the color shift on the side.

Figure 32:
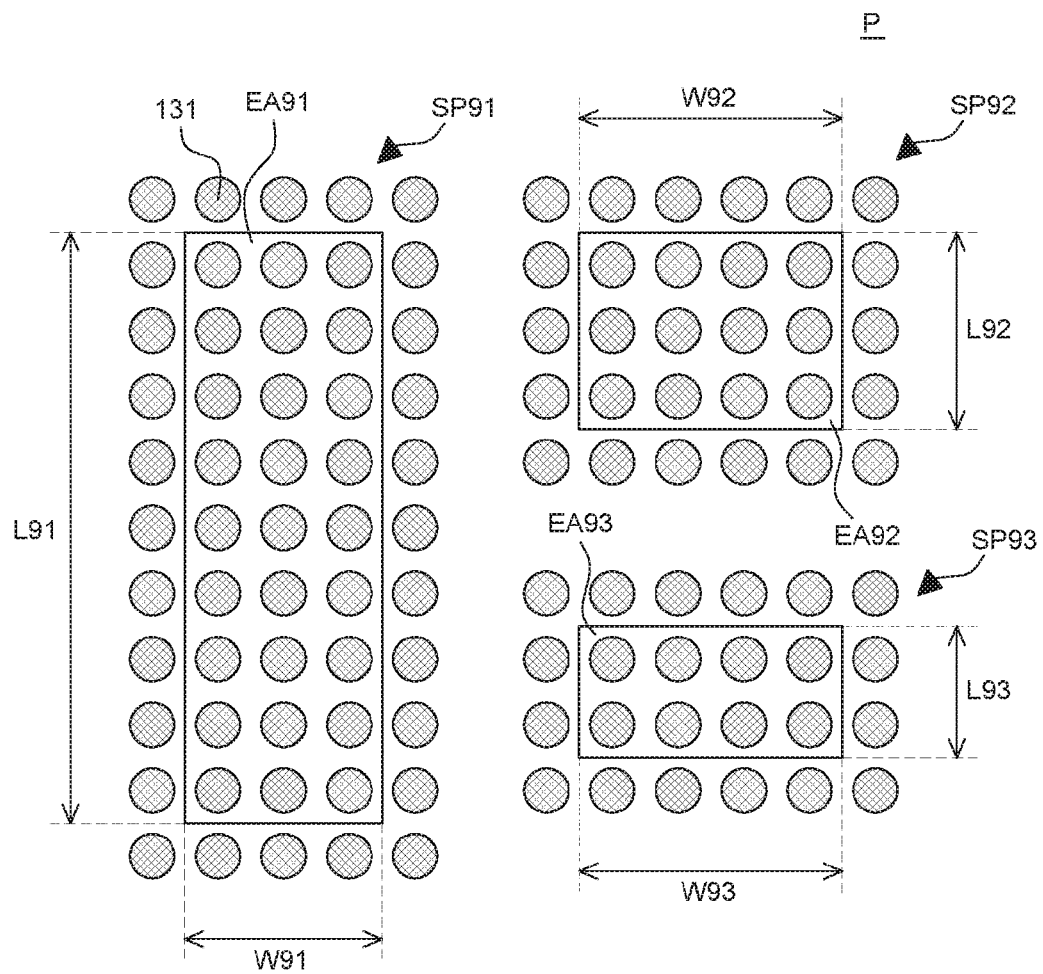
FIG. 32 is a plan view illustrating one pixel of an organic light emitting display device according to an eleventh exemplary embodiment of the present disclosure.

FIG. 32 is a plan view illustrating one pixel of an organic light emitting display device according to an eleventh exemplary embodiment of the present disclosure.

Referring to FIG. 32, in the organic light emitting display device according to the eleventh exemplary embodiment of the present disclosure, one pixel P includes a first subpixel SP91, a second subpixel SP92, and a third subpixel SP93. The first subpixel SP91, the second subpixel SP92, and the third subpixel SP93 include a first emission area EA91, a second emission area EA92, and a third emission area EA93, respectively.

The first emission area EA91, the second emission area EA92, and the third emission area EA93 include a plurality of concave portions 131, respectively, and the plurality of concave portions 131 is formed even around the emission area.

In the protective layer, in order to form the concave portions 131, a mask with holes corresponding to positions with the concave portions 131 may be prepared. In a process of exposing the protective layer using the mask with the holes, the concave portions 131 to be formed around the emission area are largely influenced by the exposure as compared with the concave portions 131 to be formed inside the emission area due to the diffraction of the light. A deviation in size between the concave portions 131 formed in the emission area may occur. As a result, a deviation of the color shift with respect to a viewing angle in one subpixel may occur.

In order to solve the problem, as illustrated in FIG. 32, the concave portions 131 are formed up to the periphery of the emission areas EA91, EA92, and EA93, thereby decreasing the difference in size between the concave portions 131 formed in the emission area and decreasing the deviation of the color shift with respect to a viewing angle in one subpixel. In this case, the concave portions 131 are formed on the protective layer, and the aforementioned effects may be achieved by including the protective layer having a non-flat shape including the convex portions in addition to the concave portions.

That is, the non-flat shape formed on the protective layer is formed in the opening of the bank layer and the area having the bank layer, thereby suppressing the deviation of the non-flat shape disposed in the emission area and decreasing the color shift with respect to a viewing angle.

Figure 33:
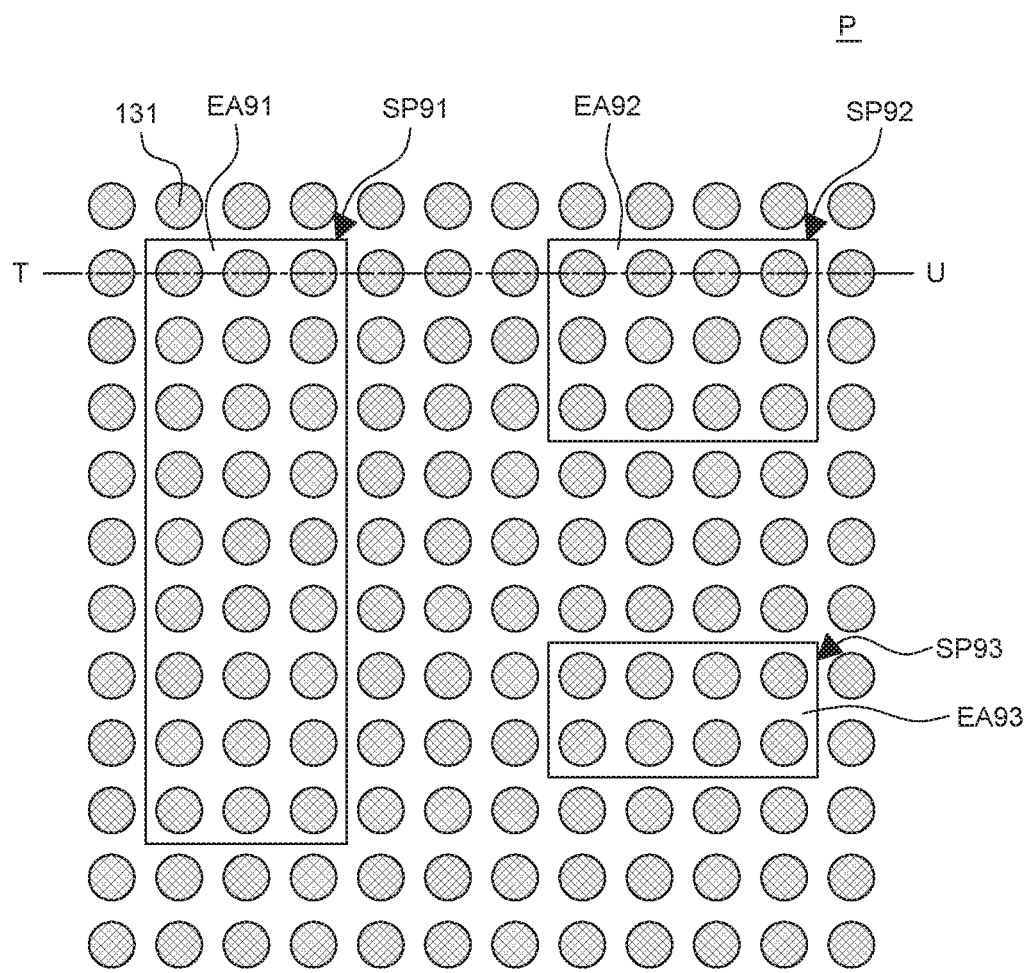
FIG. 33 is a plan view illustrating one pixel of the organic light emitting display device according to an exemplary embodiment extended based on the eleventh exemplary embodiment of the present disclosure.

FIG. 33 is a plan view illustrating one pixel of the organic light emitting display device according to an exemplary embodiment extended based on the eleventh exemplary embodiment of the present disclosure.

Referring to FIG. 33, the concave portions 131 formed in FIG. 32 may be formed to be extended to the whole surface of one pixel. In this case, a mask with holes on the whole surface, or a mask with holes in the area corresponding to at least one pixel may be used.

Like FIG. 32, the concave portions 131 are formed up to the periphery of the emission areas EA91, EA92, and EA93, thereby decreasing the deviation in size between the concave portions 131 formed in the emission area and decreasing the deviation of the color shift with respect to a viewing angle in one subpixel. In this case, the concave portions 131 are formed on the protective layer, and the aforementioned effects may be achieved by including the protective layer having a non-flat shape including the convex portions in addition to the concave portions.

That is, the non-flat shape formed on the protective layer is formed in the opening of the bank layer and the area having the bank layer, thereby suppressing the deviation of the non-flat shape disposed in the emission area and decreasing the color shift with respect to a viewing angle.

Figure 34:
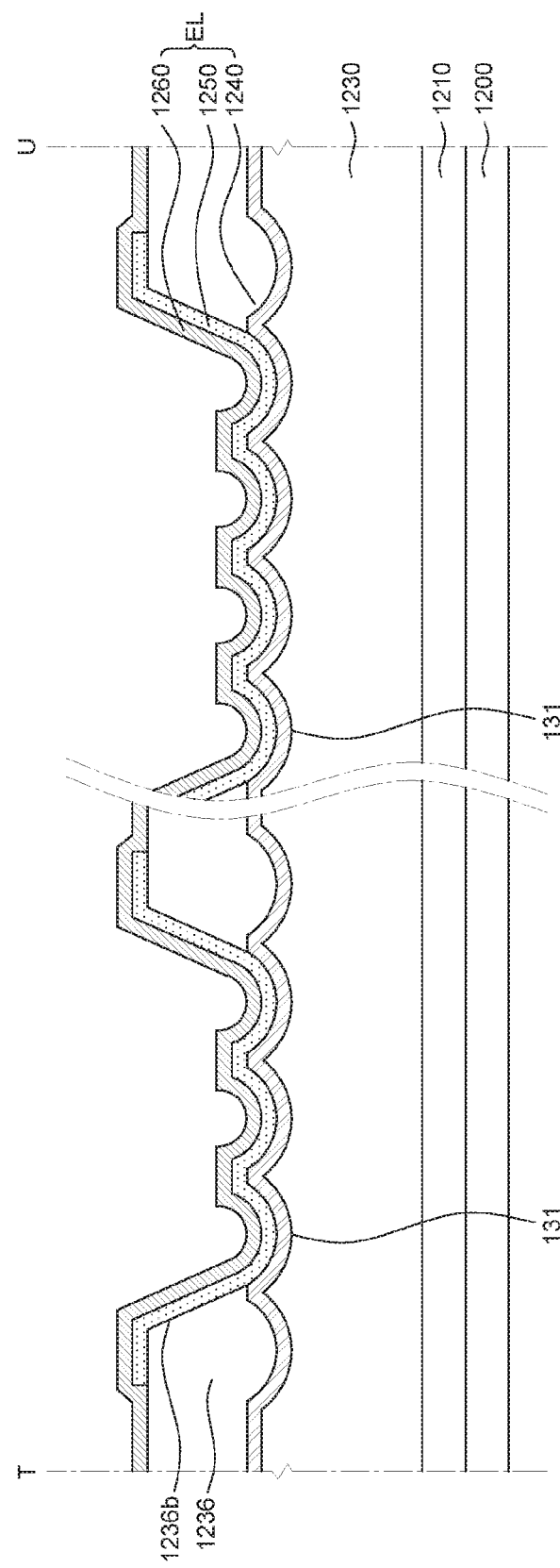
FIG. 34 is a cross-sectional view taken along line T-U of the plan view of FIG. 33.

FIG. 34 is a cross-sectional view taken along line T-U of the plan view of FIG. 33.

Referring to FIG. 34, in each subpixel SP included in the organic light emitting display device of the eleven exemplary embodiment of the present disclosure, an insulating layer 1210 and a protective layer 1230 with a plurality of concave portions 131 are disposed on a substrate 1200, and the organic light emitting diode EL is disposed on the protective layer 1230.

Particularly, on the protective layer 1230, a first electrode 1240, an organic emission layer 1250, and a second electrode 1260 of the organic emission diode EL may be sequentially disposed. In this case, shapes of the first electrode 1240, the organic emission layer 1250, and the second electrode 1260 may correspond to the shape of the concave portions 131 formed on the protective layer 1230.

Further, a bank layer 1236 with an opening 1236b corresponding to the emission area is formed on the first electrode 1240, and the concave portions 131 is formed even below the bank layer 1236. Accordingly, it is possible to decrease the deviation in size between the concave portions 131 formed in the emission area and decrease the deviation of the color shift with respect to a viewing angle in one subpixel.

Figure 35A:
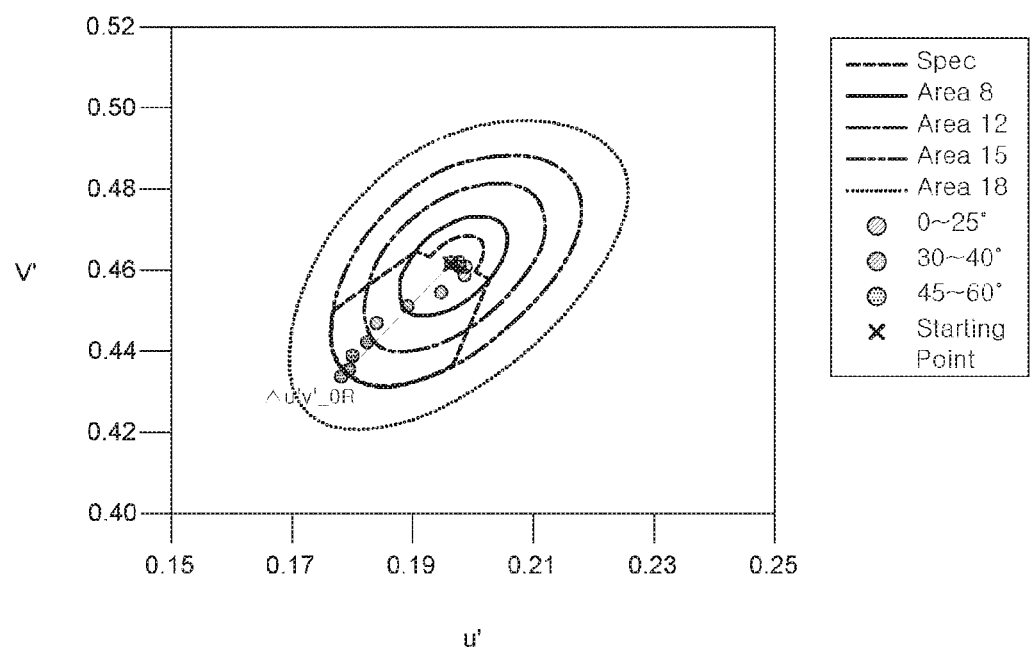
FIGS. 35A and 35D are graphs illustrating color coordinates of white light according to viewing angles in right, upper, left, and lower directions from the center of the organic light emitting display device as Comparative Example.
Figure 35B:
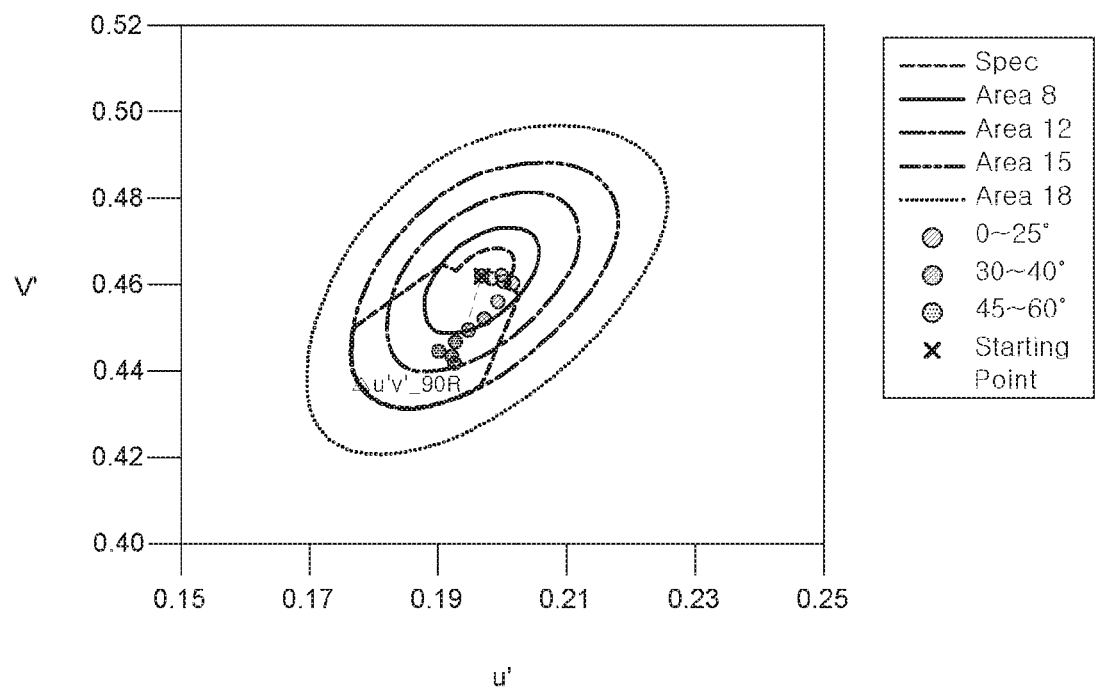
Figure 35C:
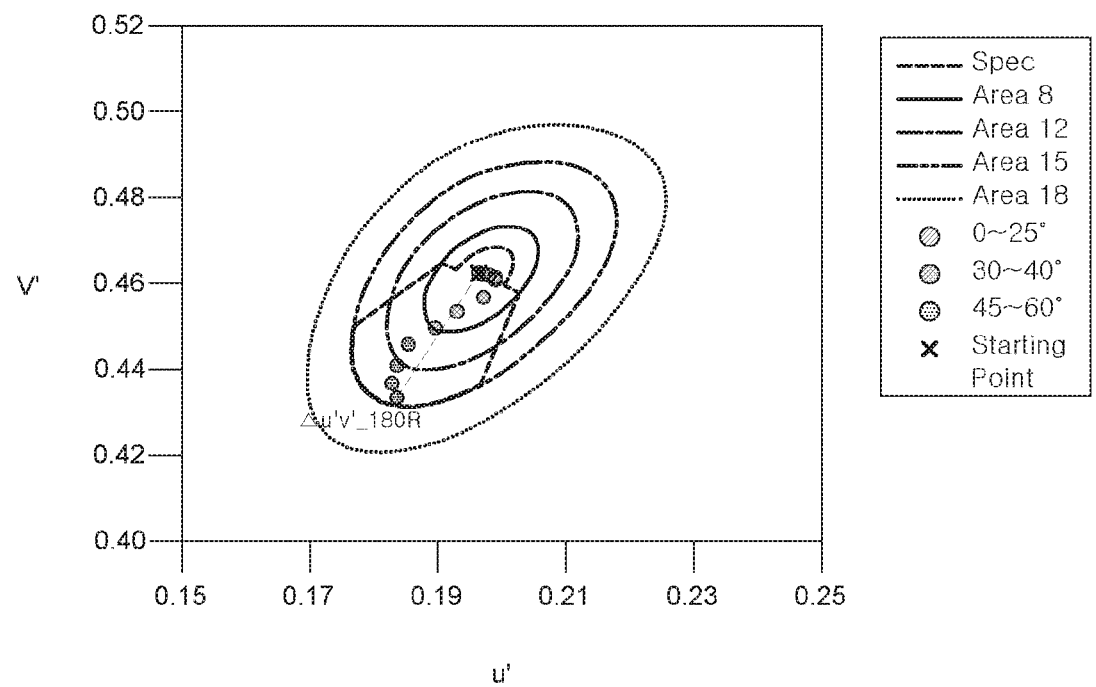
Figure 35D:
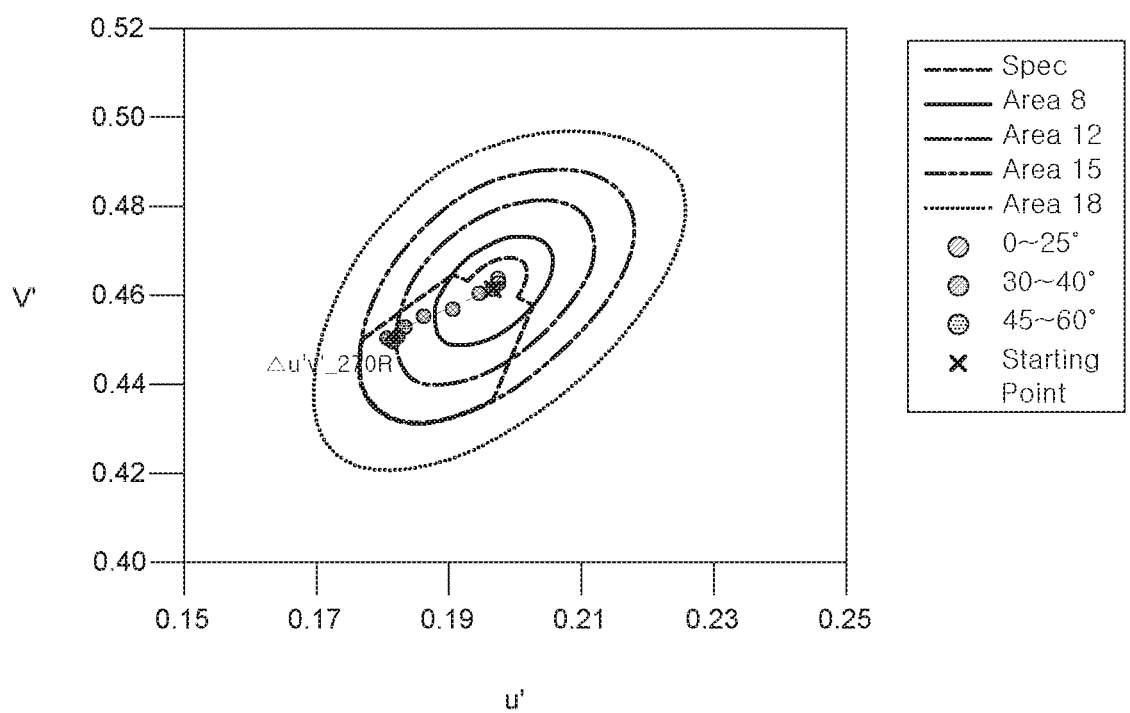
Figure 36A:
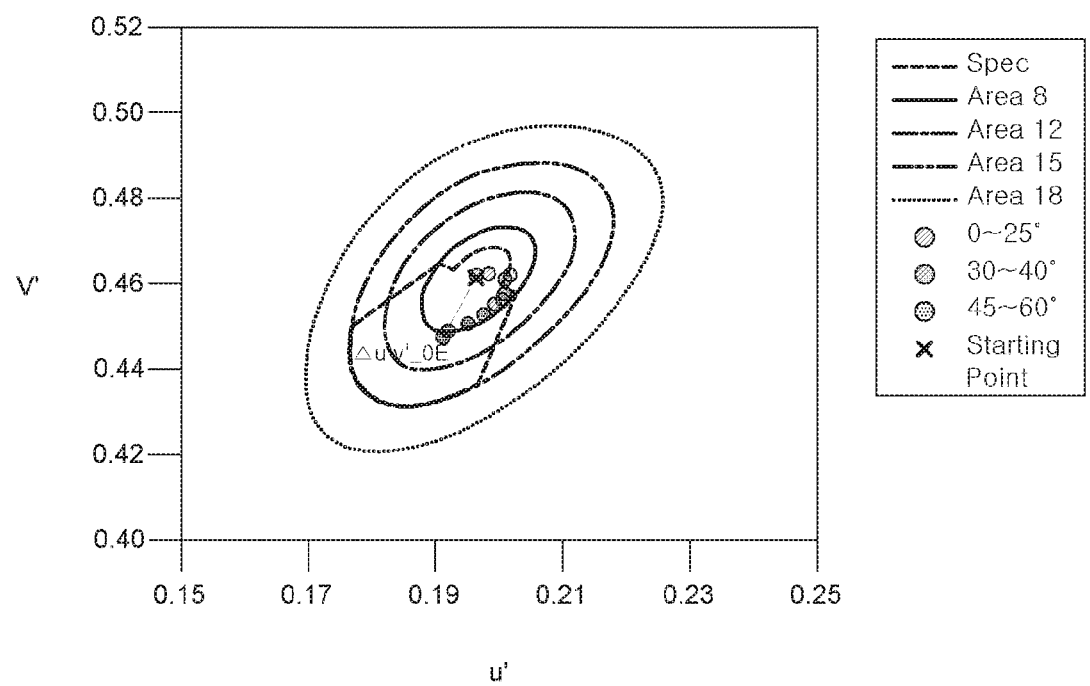
FIGS. 36A and 36D are graphs illustrating color coordinates of white light according to viewing angles in right, upper, left, and lower directions from the center of the organic light emitting display device, as Embodiment.

FIGS. 35A and 35D are graphs illustrating color coordinates of white light according to viewing angles in right, upper, left, and lower directions from the center of the organic light emitting display device, as Comparative Example. FIGS. 36A and 36D are graphs illustrating color coordinates of white light according to viewing angles in right, upper, left, and lower directions from the center of the organic light emitting display device, as Embodiment and FIGS. 36A and 36D are measured results for the organic light emitting display device according to FIG. 2. In this case, right, upper, left, and lower directions of the organic light emitting display device may be represented by azimuthal angles of 0°, 90°, 180°, and 270°, respectively. A color coordinate variation $\Delta u'v'$ means a difference between a color coordinate at 0° when the organic light emitting display is viewed from the front and a color coordinate at 60°, and a color coordinate $u'v'$ means a 1976 uniform chromaticity scale diagram (UCS) coordinate defined by International Commission on Illumination (CIE) 15.2. In addition, when the color coordinate variation is 0.030 or less, a color shift depending on a viewing angle felt by the user may be minimized and an organic light emitting display device having clearer image quality may be provided.

Viewing angles measured in FIGS. 35A and 35D are 0° to 60°, and divided and represented into groups of 0° to 25°, 30° to 40°, and 45° to 60° with an interval of 5°. A viewing angle of a starting point X is 0°.

Color coordinates of the organic light emitting display device according to Comparative Example and Example are represented based on boundary lines of area 8, area 12, area 15, and area 18 represented in oval shapes as illustrated in FIGS. 35A to 35D and FIGS. 36A to 36D. Herein, the area means a minimum difference threshold between two colors which may be recognized by the user by considering a cognitive characteristic of the user and may be expressed by a just noticeable difference (JND). As the area is decreased, a color shift depending on a viewing angle may be reduced.

In addition, white light emitted from the organic light emitting display device may be emitted to be slightly blue light, for example, bluish light so as to feel clearness and cleanliness of white with user's eyes. The color coordinate of the bluish white light may be a region around the starting point and biased in a lower left side of the starting point, that is a spec region (spec), in the graphs and the color coordinates according to the front and the viewing angles in the spec region may be present. When the spec region is within the area 12, clearer image quality may be provided. In addition, the spec regions illustrated in FIGS. 35A to 36D do not limit the contents of the present disclosure and may vary according to needs of the customers.

Graphs of FIGS. 35A to 35D are results obtained by measuring color coordinates of the organic light emitting display device to which a protective layer without a concave portion or a convex portion is applied.

Referring to FIG. 35A, while viewing the front from the center of the organic light emitting display device, FIG. 35A is a graph obtained by measuring color coordinates of white light in a right direction (azimuthal angle 0°). As the viewing angles are toward 60° from 0°, the color coordinates are far away from the starting point and the color coordinates at the front and the viewing angles are distributed within the area 16. In this case, a color coordinate variation Δu'v'_0R is about 0.033.

Referring to FIG. 35B, while viewing the front from the center of the organic light emitting display device, FIG. 35B is a graph obtained by measuring color coordinates of white light in an upper direction (azimuthal angle 90°). The color coordinates at the front and the viewing angles are distributed in the spec region within the area 12. In this case, a color coordinate variation Δu'v'_90R is about 0.021.

Referring to FIG. 35C, while viewing the front from the center of the organic light emitting display device, FIG. 35C is a graph obtained by measuring color coordinates of white light in a left direction (azimuthal angle 180°). The color coordinates at the front and the viewing angles are distributed in the spec boundary line within the area 15. In this case, a color coordinate variation Δu'v'_180R is about 0.031.

Referring to FIG. 35D, while viewing the front from the center of the organic light emitting display device, FIG. 35D is a graph obtained by measuring color coordinates of white light in a lower direction (azimuthal angle 270°). The color coordinates at the front and the viewing angles are distributed in the spec region within the area 14. In this case, a color coordinate variation Δu'v'_270R is about 0.019.

Graphs of FIGS. 36A to 36D are results obtained by measuring color coordinates of the organic light emitting display device to which the structure of the first exemplary embodiment illustrated in FIG. 2 is applied.

Referring to FIG. 36A, while viewing the front from the center of the organic light emitting display device, FIG. 36A is a graph obtained by measuring color coordinates of white light in a right direction (azimuthal angle 0°). The color coordinates at the front and the viewing angles are distributed within the area 9. In this case, a color coordinate variation Δu'v'_0E is about 0.015. In addition, as compared with Comparative Example of FIG. 35A, Embodiment is within the area 9, and thus the color coordinate variation may be decreased and the color shift depending on a viewing angle may be decreased.

Figure 36B:
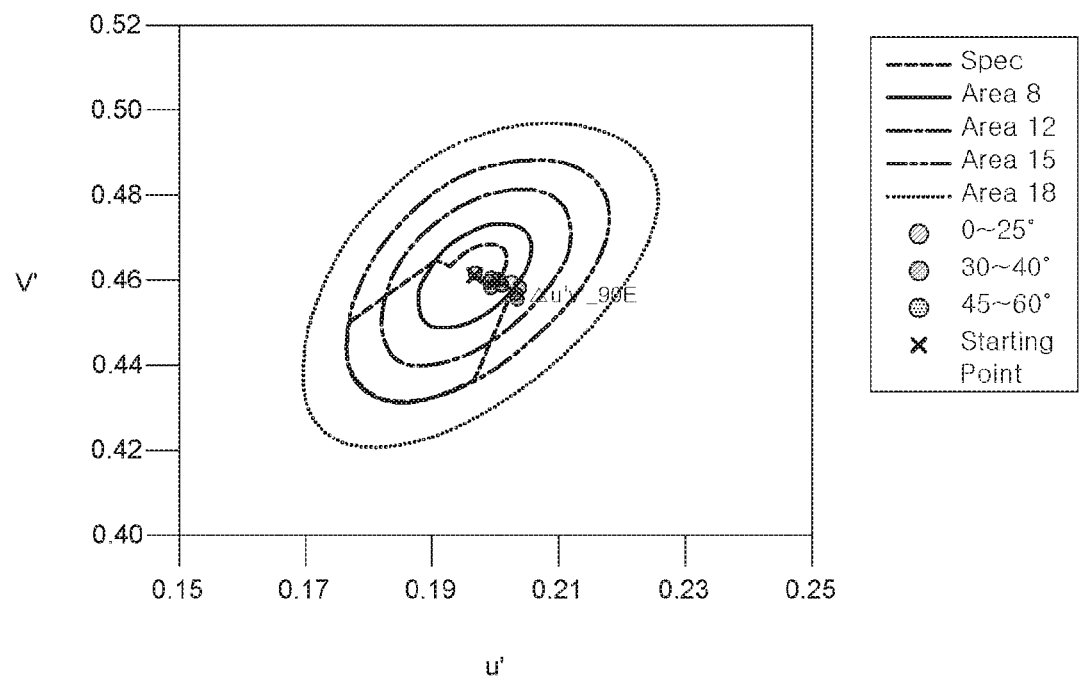

Referring to FIG. 36B, while viewing the front from the center of the organic light emitting display device, FIG. 36B is a graph obtained by measuring color coordinates of white light in an upper direction (azimuthal angle 90°). The color coordinates at the front and the viewing angles are distributed within the area 11. In this case, a color coordinate variation Δu'v'_90E is about 0.009. In addition, as compared with Comparative Example of FIG. 35B, Embodiment is within the area 11, and thus the color coordinate variation may be decreased and the color shift depending on a viewing angle may be decreased.

Figure 36C:
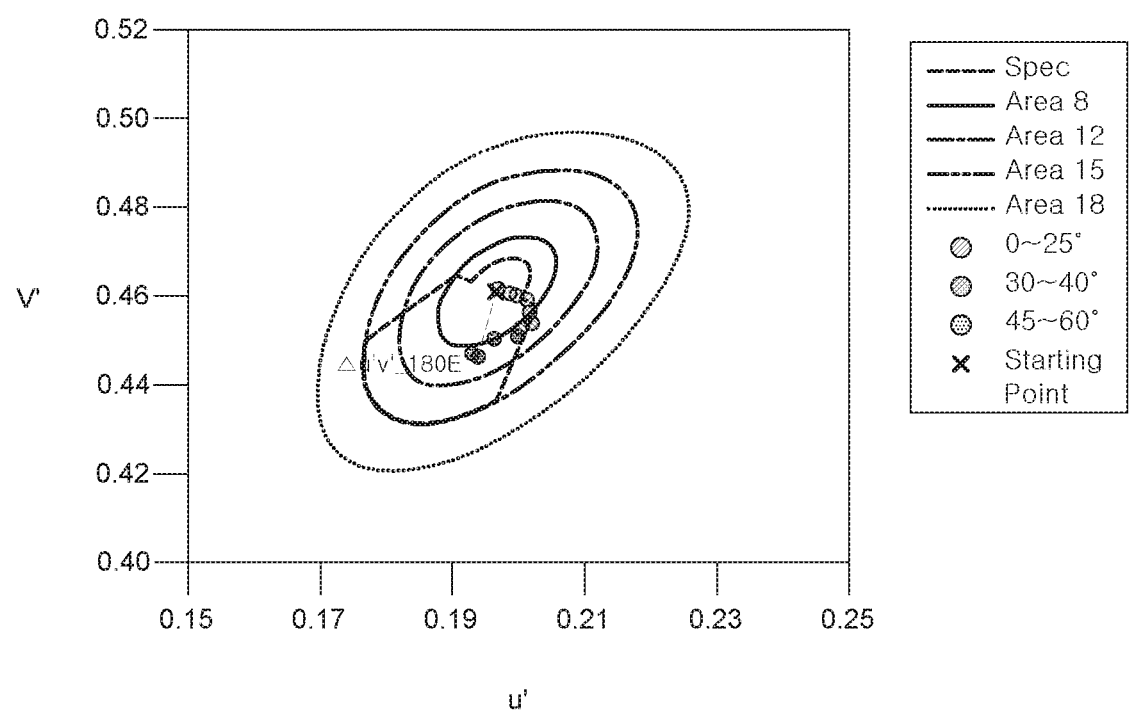
Figure 36D:
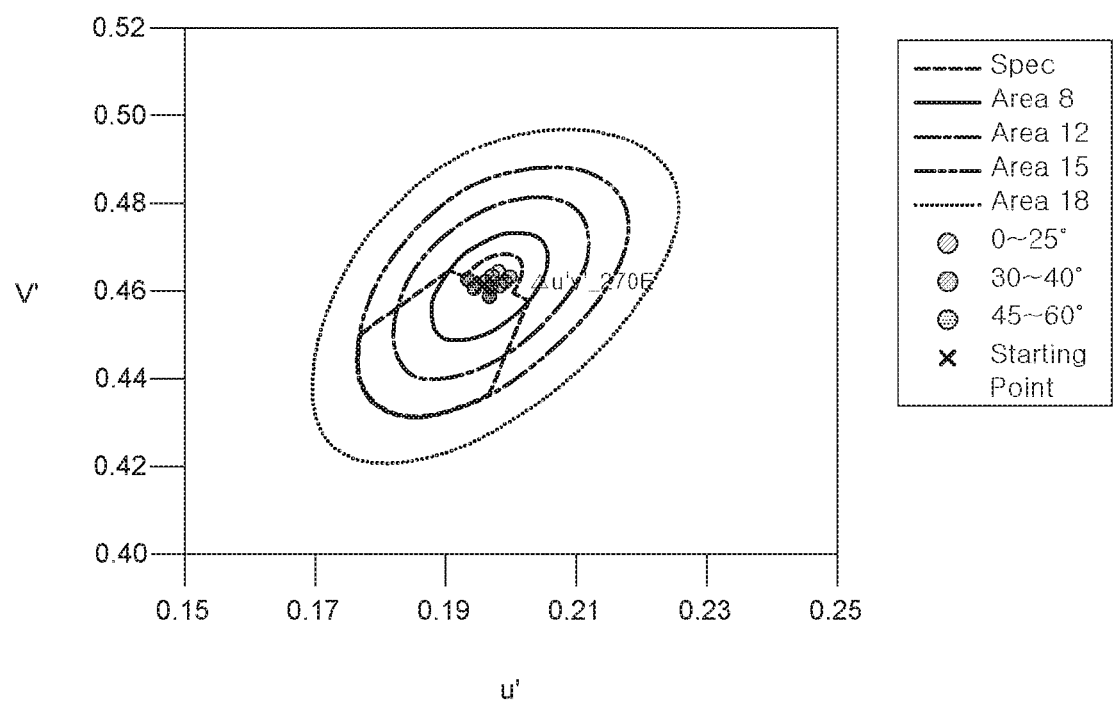

Referring to FIG. 36C, while viewing the front from the center of the organic light emitting display device, FIG. 36C is a graph obtained by measuring color coordinates of white light in a left direction (azimuthal angle 180°). The color coordinates at the front and the viewing angles are distributed within the area 10. In this case, a color coordinate variation Δu'v'_180E is about 0.015. In addition, as compared with Comparative Example of FIG. 35C, Embodiment is within the area 10, and thus the color coordinate variation may be decreased and the color shift depending on a viewing angle may be decreased.

Referring to FIG. 36D, while viewing the front from the center of the organic light emitting display device, FIG. 36D is a graph obtained by measuring color coordinates of white light in a lower direction (azimuthal angle 270°). The color coordinates at the front and the viewing angles are distributed within the area 8. In this case, a color coordinate variation Δu'v'_270E is about 0.004. In addition, as compared with Comparative Example of FIG. 35D, Embodiment is within the area 8, and thus the color coordinate variation may be decreased and the color shift depending on a viewing angle may be decreased.

When comparing the distribution of the color coordinates of Comparative Example and Embodiment according to viewing angles and the color coordinate variation, as compared with Comparative Example, in Embodiment, it can be verified that the distribution of the color coordinates is positioned within the area closer to the starting point and the color coordinate variation is decreased. That is, the color coordinate variation of the white light emitted from the organic light emitting display device in Embodiment including the protective layer having the concave portion or the convex portion is smaller than a maximum value of the color coordinate variation of the white light emitted from the organic light emitting display device in Comparative Example including a flat protective layer. In addition, in the organic light emitting display device in Embodiment, color coordinates according to viewing angles may be within the area 12. Accordingly, when Embodiment is applied, the color shift depending on a viewing angle may be decreased and efficiency of the organic light emitting element may be improved.

Like FIGS. 32 and 33, even when a plurality of concave portions or convex portions is formed even around the emission area, this may have almost the same effect. As described above, the reason why the plurality of concave portions or convex portions is formed around the emission area is to reduce a deviation in color shift depending on a viewing angle in one subpixel by minimizing generation of a difference in size of the plurality of concave portions or convex portions to be formed inside the emission area and around the emission area. Accordingly, the organic light emitting display device in which the plurality of concave portions or convex portions is formed at a part around the emission area or the entire pixels may have almost the same effect as the organic light emitting display device in which the plurality of concave portions or convex portions is formed only in the emission area.

The exemplary embodiments of the present disclosure can also be described as follows:

According to an aspect of the present disclosure, there is provided a substrate for an organic light emitting display device including a protective layer, a first electrode, and a bank layer. The protective layer has a non-flat shape. The first electrode is positioned on the protective layer and has the non-flat shape. The bank layer is positioned on the protective layer and the first electrode and includes an opening for exposing the first electrode. The protective layer is in the opening of the bank layer and a part of an area with the bank layer. The non-flat shape formed on the protective layer decreases the deviation of the optical path length with respect to a viewing angle to minimize a color shift with respect to a viewing angle. Accordingly, the lifespan of the organic light emitting display device may be improved.

The protective layer may include a plurality of concave portions or convex portions, and the concave portions or the convex portions may be disposed to be spaced apart from adjacent concave portions or convex portions at regular intervals.

The plurality of concave portions or convex portions may include a first concave portion and a second concave portion or a first convex portion and a second convex portion, and a third concave portion or a third convex portion may be further disposed between the first concave portion and the second concave portion or the first convex portion and the second convex portion to be adjacent to the second concave portion or the second convex portion to form a zigzag array.

The plurality of concave portions or convex portions may be disposed in a wider area than the opening of the bank layer.

The plurality of concave portions or convex portions may be disposed on whole surface of the protective layer.

A slope of the opening of the bank layer may have 40° or higher or the opening may have a curved shape.

The substrate may further include an emission area including the opening of the bank layer, in which the emission area may include a first emission area, a second emission area, and a third emission area, and a vertical length of the first emission area may be larger than the vertical lengths of the second and third emission areas.

The vertical lengths of the second and third emission areas may be different from each other.

The substrate may further include an emission area including the opening of the bank layer, in which the emission area may include a first emission area, a second emission area, and a third emission area, and a horizontal length of the first emission area may be smaller than the horizontal lengths of the second and third emission areas.

The horizontal lengths of the second and third emission areas may be different from each other.

According to another aspect of the present disclosure, there is provided an organic light emitting display device including a bank layer, a protective layer and an organic emission layer. The protective layer has a viewing angle enhancement structure. The organic light emitting display device includes a plurality of pixels and subpixels constituting the pixels. The bank layer exposes an emission area of the subpixel and includes an inclined opening. The organic emission layer is disposed on the protective layer is along a form of the viewing angle enhancement structure. The viewing angle enhancement structure formed on the protective layer decreases the deviation of the optical path length with respect to a viewing angle to minimize a color shift with respect to a viewing angle. Accordingly, the lifespan of the organic light emitting element may be improved.

The organic light emitting display device may include two or more subpixels. The protective layer and the organic emission layer in at least one subpixel of the at least two or more subpixels do not include viewing angle enhancement structure.

The viewing angle enhancement structure may include a concave portion or a convex portion.

A diameter of the concave portion or convex portion may be 2 μm to 6 μm.

A height of the concave portion or convex portion may be 0.05 μm to 2 μm.

The concave portion or a convex portion includes a plurality of concave portions or convex portions, and each of a gap between the concave portions and a gap between the convex portions may be 1 μm to 2 μm.

The concave portion or the convex portion may include a plurality of concave portions or convex portions, and the concave portions or convex portions may be disposed so that all internal angles of a triangle formed when centers of three adjacent concave portions or convex portions are connected to each other become an acute angle.

The subpixels may include two or more subpixels. The protective layer of one subpixel of two or more subpixels may include the concave portion and the protective layer of the other subpixel may include the convex portion.

A slope of the opening of the bank layer may have 40° or higher or the opening may have a curved shape.

The bank layer may include two or more openings exposing the emission area.

The components of the aforementioned exemplary embodiments and the effects of the components may be applied to the substrate for the organic light emitting display device and the organic light emitting display device.

Features, structures, effects, and the like described in the aforementioned exemplary embodiments are included in at least one exemplary embodiment of the present disclosure and is not particularly limited to only one exemplary embodiment. Furthermore, the feature, the structure, the effect, and the like exemplified in each exemplary embodiment are combined or modified to be executed even with respect to other exemplary embodiments by those skilled in the art to which the exemplary embodiments pertain. Therefore, it should be construed that contents associated with the combination and modification are included in the scope of the present disclosure.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A substrate for an organic light emitting display device, comprising:
    a protective layer having a non-flat shape and including a plurality of concave portions or convex portions;
    a first electrode on the protective layer, the first electrode having the non-flat shape; and
    a bank layer on the protective layer and the first electrode, the bank layer including an opening for exposing the first electrode,
    wherein the protective layer is in the opening of the bank layer and a part of an area with the bank layer,
    wherein the plurality of concave portions or convex portion include a first concave portion and a second concave portion or a first convex portion and a second convex portion, and
    wherein a third concave portion or a third convex portion is further disposed between the first concave portion and the second concave portion or the first convex portion and the second convex portion to be adjacent to the second concave portion or the second convex portion to form a zigzag array.

2. The substrate of claim 1, wherein the protective layer is configured to decrease a color shift with respect to a viewing angle.

3. The substrate of claim 1, wherein the plurality of concave portions or convex portions is disposed on a whole surface of the protective layer.

4. The substrate of claim 1, wherein a slope of the opening of the bank layer has 40° or higher, or the opening has curved shape.

5. A substrate for an organic light emitting display device, comprising:
    a protective layer having a non-flat shape and including a plurality of concave portions or convex portions;
    a first electrode on the protective layer, the first electrode having the non-flat shape; and a bank layer on the protective layer and the first electrode, the bank layer including an opening for exposing the first electrode,
wherein the plurality of concave portions or convex portions is disposed in a wider area than the opening of the bank layer.

6. The substrate of claim 5, wherein the plurality of concave portions or convex portions is disposed on a whole surface of the protective layer.

7. The substrate of claim 5, wherein a slope of the opening of the bank layer has 40° or higher, or the opening has curved shape.

8. A substrate for an organic light emitting display device, comprising:
a protective layer having a non-flat shape and including a plurality of concave portions or convex portions;
a first electrode on the protective layer, the first electrode having the non-flat shape;
a bank layer on the protective layer and the first electrode, the bank layer including an opening for exposing the first electrode; and
an emission area including the opening of the bank layer, wherein the emission area includes a first emission area, a second emission area, and a third emission area, and
a vertical length of the first emission area is larger than the vertical lengths of the second and third emission areas.

9. The substrate of claim 8, wherein the vertical lengths of the second and third emission areas are different from each other.

10. A substrate for an organic light emitting display device, comprising:
a protective layer having a non-flat shape and including a plurality of concave portions or convex portions;
a first electrode on the protective layer, the first electrode having the non-flat shape;
a bank layer on the protective layer and the first electrode, the bank layer including an opening for exposing the first electrode; and
an emission area including the opening of the bank layer, wherein the emission area includes a first emission area, a second emission area, and a third emission area, and
a horizontal length of the first emission area is smaller than the horizontal lengths of the second and third emission areas.

11. The substrate of claim 10, wherein the horizontal lengths of the second and third emission areas are different from each other.

12. An organic light emitting display device including a plurality of pixels and subpixels constituting the pixels, comprising:
a bank layer exposing an emission area of the subpixel and including an inclined opening;
a protective layer including a viewing angle enhancement structure; and
an organic emission layer on the protective layer, the organic emission layer being along a form of the viewing angle enhancement structure,
wherein the view angle enhancement structure includes a concave portion or a convex portion, and
wherein the concave portion or a convex portion includes a plurality of concave portions or convex portions, and each of a gap between the concave portions and a gap between the convex portions is 1 μm to 2 μm.

13. The organic light emitting display device of claim 12, wherein the subpixels includes at least two or more subpixels, and
wherein the protective layer and the organic emission layer in at least one subpixel of the at least two or more subpixels do not include the viewing angle enhancement structure.

14. The organic light emitting display device of claim 12, wherein a slope of the opening of the bank layer has 40° or higher, or the opening has a curved shape.

15. The organic light emitting display device of claim 12, wherein a diameter of the concave portion or convex portion is 2 μm to 6 μm.

16. The organic light emitting display device of claim 12, wherein a height of the concave portion or convex portion is 0.05 μm to 2 μm.

17. The organic light emitting display device of claim 12, wherein the bank layer includes at least two or more openings exposing the emission area.

18. An organic light emitting display device including a plurality of pixels and subpixels constituting the pixels, comprising:
a bank layer exposing an emission area of the subpixel and including an inclined opening;
a protective layer including a viewing angle enhancement structure; and
an organic emission layer on the protective layer, the organic emission layer being along a form of the viewing angle enhancement structure,
wherein the view angle enhancement structure includes a concave portion or a convex portion, and
wherein the concave portion or a convex portion includes a plurality of concave portions or convex portions, and the concave portions or convex portions are disposed so that all internal angles of a triangle formed when centers of three adjacent concave portions or convex portions are connected to each other become an acute angle.

19. An organic light emitting display device including a plurality of pixels and subpixels constituting the pixels, comprising:
a bank layer exposing an emission area of the subpixel and including an inclined opening;
a protective layer including a viewing angle enhancement structure; and
an organic emission layer on the protective layer, the organic emission layer being along a form of the viewing angle enhancement structure,
wherein the subpixels include at least two or more subpixels, the protective layer of one subpixel of the at least two or more subpixels includes the concave portion, and the protective layer of the other subpixel includes the convex portion.

20. The organic light emitting display device of claim 19, wherein a slope of the opening of the bank layer has 40° or higher, or the opening has a curved shape.

21. The organic light emitting display device of claim 19, wherein the bank layer includes at least two or more openings exposing the emission area.

* * * * *